(12) United States Patent
Das Sharma et al.

(10) Patent No.: US 12,360,934 B2
(45) Date of Patent: Jul. 15, 2025

(54) PARAMETER EXCHANGE FOR A DIE-TO-DIE INTERCONNECT

(71) Applicant: Intel Corporation, Santa Clara, CA (US)

(72) Inventors: Debendra Das Sharma, Saratoga, CA (US); Mahesh S. Natu, Folsom, CA (US); Sridhar Muthrasanallur, Bengaluru (IN); Swadesh Choudhary, Mountain View, CA (US); Narasimha Lanka, Dublin, CA (US); Lakshmipriya Seshan, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 390 days.

(21) Appl. No.: 17/855,687

(22) Filed: Jun. 30, 2022

(65) Prior Publication Data

US 2022/0334995 A1  Oct. 20, 2022

(30) Foreign Application Priority Data

Dec. 30, 2021 (IN) .............................. 202141061716

(51) Int. Cl.
*G06F 13/40* (2006.01)
*G06F 13/42* (2006.01)
(Continued)

(52) U.S. Cl.
CPC ........ *G06F 13/405* (2013.01); *G06F 13/4221* (2013.01); *G06F 13/4273* (2013.01); *G06F 2213/0024* (2013.01); *G06F 2213/0026* (2013.01); *H01L 23/5381* (2013.01); *H01L 23/5385* (2013.01); *H01L 23/5386* (2013.01); *H01L 24/16* (2013.01);
(Continued)

(58) Field of Classification Search
CPC ............... G06F 13/405; G06F 13/4273; G06F 13/4221; G06F 13/40; G06F 13/42
See application file for complete search history.

(56) References Cited

U.S. PATENT DOCUMENTS

2013/0047168 A1  2/2013 Shah et al.
2014/0108697 A1  4/2014 Wagh
(Continued)

OTHER PUBLICATIONS

PCT International Search Report and Written Opinion issued in PCT/US2022/051299, dated Mar. 31, 2023; 9 pages.

*Primary Examiner* — Raymond N Phan
(74) *Attorney, Agent, or Firm* — Alliance IP, LLC

(57) ABSTRACT

A port is to couple to another die over a die-to-die (D2D) link and includes a die-to-die (D2D) adapter to determine, from a set of registers, a set of capabilities of the D2D adapter to advertise in a negotiation with a link partner D2D adapter, where the D2D adapter is on a die and the link partner D2D adapter is located on a remote link partner die. A first capabilities advertisement message is sent to the link partner D2D adapter to advertise the set of capabilities to the link partner D2D adapter. A second capabilities advertisement message is received from the link partner D2D adapter, wherein the second capabilities advertisement message identifies a set of capabilities of the link partner D2D adapter. A final configuration of a D2D link is determined to couple the die to the link partner die.

20 Claims, 29 Drawing Sheets

(51) Int. Cl.
  *H01L 23/00*      (2006.01)
  *H01L 23/538*     (2006.01)
  *H01L 25/065*     (2023.01)

(52) U.S. Cl.
  CPC .............................. *H01L 25/0655* (2013.01); *H01L 2224/16225* (2013.01); *H01L 2924/1431* (2013.01); *H01L 2924/1434* (2013.01)

(56)                References Cited

U.S. PATENT DOCUMENTS

| | | |
|---|---|---|
| 2017/0004098 A1 | 1/2017 | Sharma et al. |
| 2019/0065426 A1 | 2/2019 | Sharma et al. |
| 2020/0210366 A1 | 7/2020 | Sharma et al. |
| 2020/0327084 A1 | 10/2020 | Choudhary et al. |
| 2020/0327088 A1 | 10/2020 | Choudhary et al. |
| 2020/0394150 A1 | 12/2020 | Lanka et al. |
| 2022/0012140 A1 | 1/2022 | Sharma et al. |
| 2022/0334995 A1 | 10/2022 | Sharma et al. |
| 2022/0342841 A1* | 10/2022 | Choudhary ......... G06F 13/4221 |

* cited by examiner

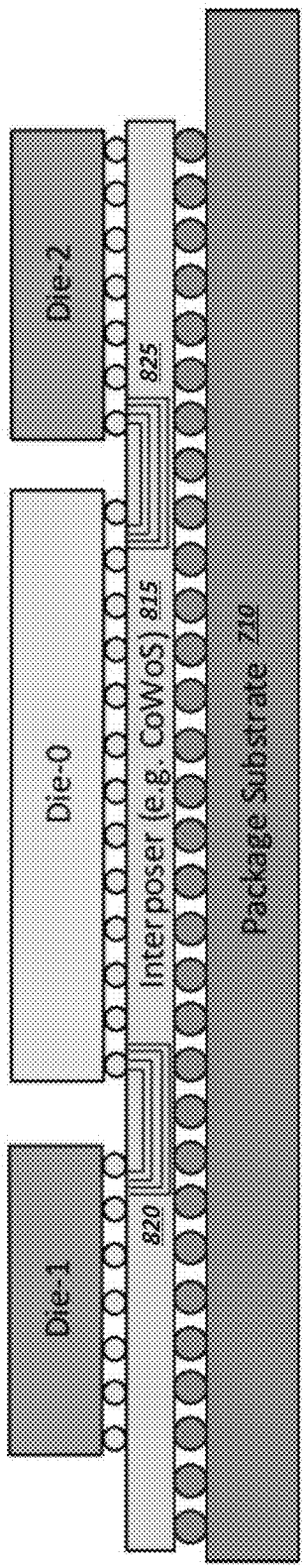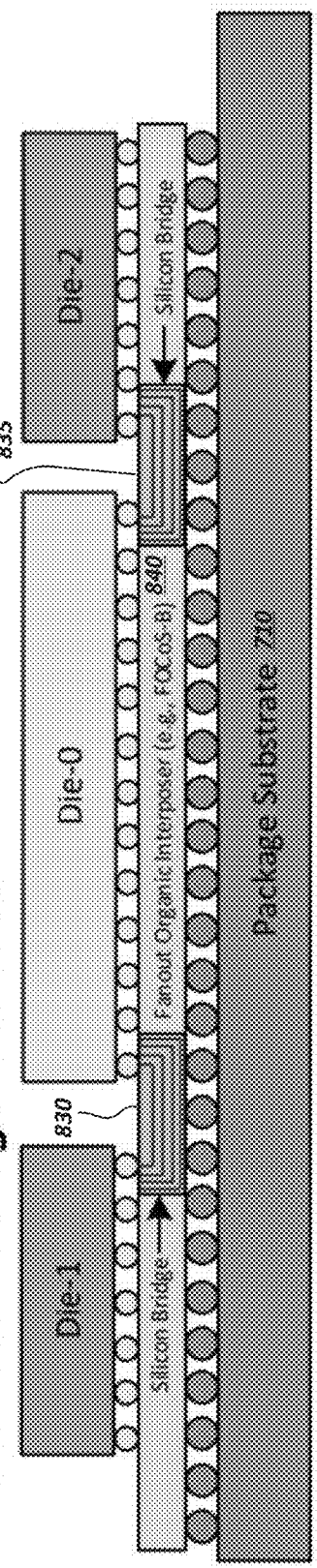
FIG. 8B
FIG. 8C

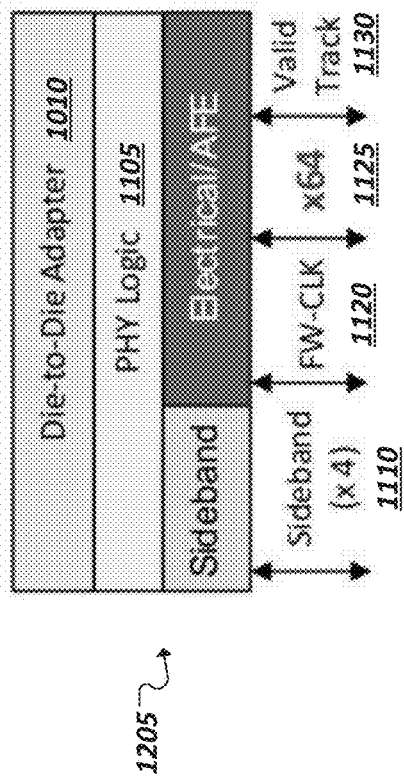
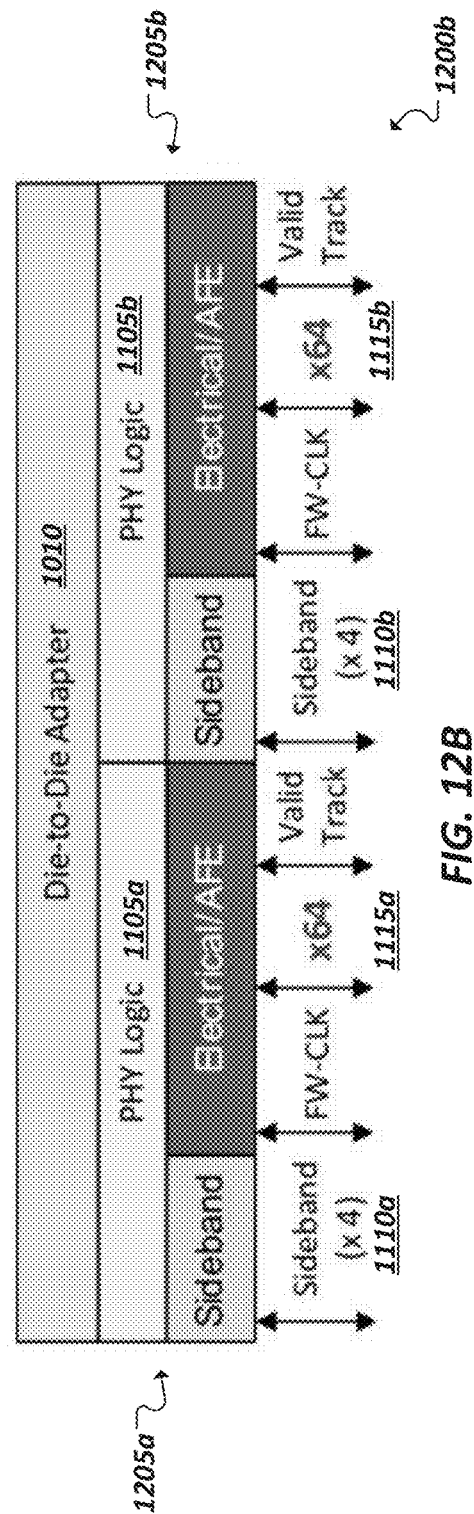
FIG. 12A
FIG. 12B

| PCI Express Extended Capability Header |  |
|---|---|
| Designated Vendor Specific Header 1 | |
| Capability Descriptor | Designated Vendor Specific Header 2 |
| UCIe Link Capability 1405 | |
| UCIe Link Control 1410 | |
| UCIe Link Status 1415 | |
| Error Notification Control | Link Event Notification Control |
| Register Locator 0 Low | |
| Register Locator 0 High | |
| ... | |
| ... | |
| Reserved | |
| Side band Mailbox Index Low 1420a | |
| Side band Mailbox Index High 1420b | |
| Sideband Mailbox Data Low 1420c | |
| Sideband Mailbox Data High 1420d | |
| 1420e | Mailbox Status | Mailbox Control 1420f |
| RequesterID/Reserved | |
| Reserved | |
| Associated Port Numbers (1-N) | |
| ... | |

*FIG. 14* 

| Bytes | 3 | | | | 2 | | | | 1 | | | | 0 | | | |
|---|---|---|---|---|---|---|---|---|---|---|---|---|---|---|---|---|
| Bits | 31 30 29 28 | 27 | 26 25 24 | 23 22 21 20 19 18 17 16 | 15 14 13 12 11 10 9 8 | 7 6 5 4 | 3 2 1 0 |

Register Access Completions

| Header / Data | | | | | |
|---|---|---|---|---|---|
| Phase0 | srcid | rsvd | tag[4:0] | rsvd | opcode[4:0] |
| Phase1 | dp cp cr | rsvd | dstid | be[7:0] | ep Status |

Header / Data — Data (if completion with data, can be 32 bits or 64 bits)

| Phase2 | data[31:0] |
| Phase3 | data[63:32] |

~1800b

| Bytes | 3 | | | | | | | | 2 | | | | | | | | 1 | | | | | | | | 0 | | | | | | | |
|---|---|---|---|---|---|---|---|---|---|---|---|---|---|---|---|---|---|---|---|---|---|---|---|---|---|---|---|---|---|---|---|---|
| Bits | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
| Header / Data | | | | | | | | | | | | | | | | | Header | | | | | | | | | | | | | | | |
| Phase0 | srcid | | | | rsvd | | | | rsvd | | | | | | | | msgcode[7:0] | | | | | | | | rsvd | | | opcode[4:0] | | | | |
| Phase1 | dp | cp | | | rsvd | | | | dstid | | | | | | | | MsgInfo[15:0] | | | | | | | | | | | | MsgSubcode[7:0] | | | |

Messages without Data

PARAMETER EXCHANGE FOR A DIE-TO-DIE INTERCONNECT

RELATED APPLICATIONS

This application claims benefit under 35 U.S.C. 119 to Indian Provisional Patent Application Serial No. 202141061716, filed Dec. 30, 2021, entitled "Software Visibility and Protocol Parameter Exchange Flows for Die-To-Die (D2D) Interconnects," which is incorporated by reference herein in its entirety.

FIELD

This disclosure pertains to computing systems, and in particular (but not exclusively) to physical interconnects and related link protocols.

BACKGROUND

Advances in semi-conductor processing and logic design have permitted an increase in the amount of logic that may be present on integrated circuit devices. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically comprises a single physical processor die, where the processor die may include any number of cores, hardware threads, logical processors, interfaces, memory, controller hubs, etc.

As a result of the greater ability to fit more processing power in smaller packages, smaller computing devices have increased in popularity. Smartphones, tablets, ultrathin notebooks, and other user equipment have grown exponentially. However, these smaller devices are reliant on servers both for data storage and complex processing that exceeds the form factor. Consequently, the demand in the high-performance computing market (i.e. server space) has also increased. For instance, in modern servers, there is typically not only a single processor with multiple cores, but also multiple physical processors (also referred to as multiple sockets) to increase the computing power. But as the processing power grows along with the number of devices in a computing system, the communication between sockets and other devices becomes more critical.

In fact, interconnects have grown from more traditional multi-drop buses that primarily handled electrical communications to full blown interconnect architectures that facilitate fast communication. Unfortunately, as the demand for future processors to consume at even higher-rates corresponding demand is placed on the capabilities of existing interconnect architectures.

BRIEF DESCRIPTION OF THE DRAWINGS

FIGS. 8A-8D illustrates simplified block diagram of example package configurations.

FIGS. 12A-12C are simplified block diagrams of example protocol stack implementations.

FIG. 14 is a representation of an example register for use with a UCIe-based link.

FIGS. 17A-17F show example data formats for use with a UCIe-based link.

FIGS. 18A-18D show example sideband message formats

DETAILED DESCRIPTION

Figure 1:
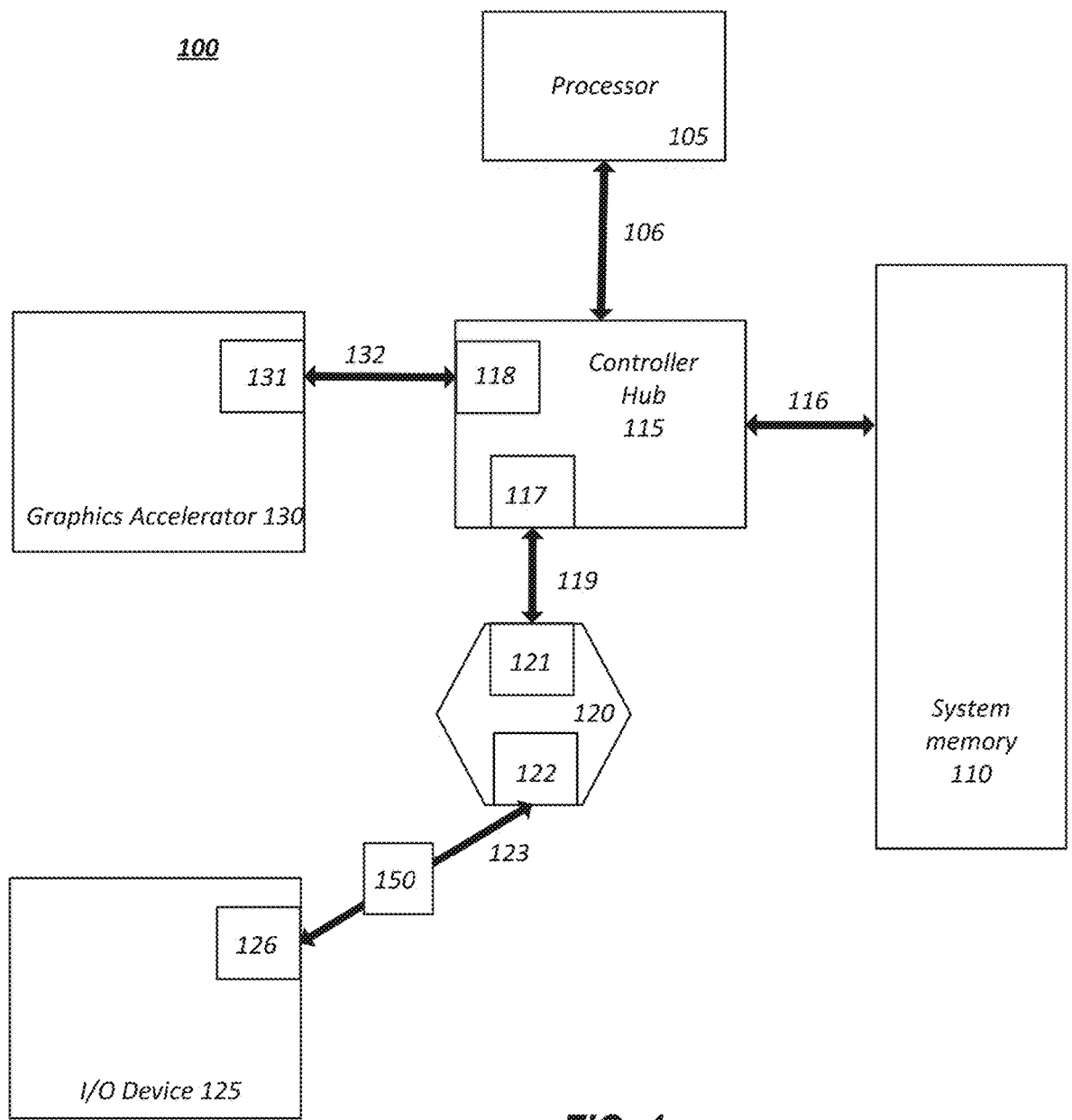
FIG. 1 illustrates an embodiment of a computing system including an interconnect architecture.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the solutions provided in the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present disclosure.

Although the following embodiments may be described with reference to specific integrated circuits, such as in computing platforms or microprocessors, other embodiments are applicable to other types of integrated circuits and logic devices. Similar techniques and teachings of embodiments described herein may be applied to other types of circuits or semiconductor devices. For example, the disclosed embodiments are not limited to desktop computer systems or Ultrabooks™ and may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. The techniques and teachings of embodiments described herein may also be applied at the server level, including rack scale server platforms, blade server platforms, and other server architectures. Moreover, the apparatus', methods, and systems described herein are not limited to physical computing devices, but may also relate to software emulations and simulations of physical systems, such as those architectures discussed in the examples below. As will become readily apparent in the description below, the embodiments of methods, apparatus', and systems described herein (whether in reference to hardware, firmware, software, or a combination thereof) are important in enabling computing platforms to handle increasing data speeds while balancing power usage and physical footprint, among other example considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the solutions described herein.

Modern interconnect fabric architectures enable components and devices from different vendors to inter-operate in an open architecture, spanning multiple market segments; Clients (Desktops and Mobile), Servers (Standard and Enterprise), and Embedded and Communication devices. For instance, high performance, general purpose I/O interconnect protocols (e.g., Peripheral Component Interconnect Express (PCIe)) have been defined for a wide variety of future computing and communication platforms. Such protocols and corresponding architectures may take advantage of advances in point-to-point interconnects, switch-based technology, and packetized protocol to deliver new levels of performance and features. As an example, Power Management, Quality Of Service (QoS), Hot-Plug/Hot-Swap support, Data Integrity, and Error Handling are among some of the advanced features supported by PCI Express.

Referring to FIG. 1, an embodiment of a fabric composed of point-to-point Links that interconnect a set of components is illustrated. System 100 includes processor 105 and system memory 110 coupled to controller hub 115. Processor 105 includes any processing element, such as a microprocessor, a host processor, an embedded processor, a co-processor, or other processor. Processor 105 is coupled to controller hub 115 through front-side bus (FSB) 106. In one embodiment, FSB 106 is a serial point-to-point interconnect as described below. In another embodiment, link 106 includes a serial, differential interconnect architecture that is compliant with different interconnect standard. Interconnect protocols and features discussed below may be utilized to implement the fabric and links coupling the set of components introduced here in FIG. 1.

System memory 110 includes any memory device, such as random access memory (RAM), non-volatile (NV) memory, or other memory accessible by devices in system 100. System memory 110 is coupled to controller hub 115 through memory interface 116. Examples of a memory interface include a double-data rate (DDR) memory interface, a dual-channel DDR memory interface, and a dynamic RAM (DRAM) memory interface.

In one embodiment, controller hub 115 may be implemented as a root hub, root complex, or root controller in a PCIe interconnection hierarchy. Examples of controller hub 115 include a chipset, a memory controller hub (MCH), a northbridge, an interconnect controller hub (ICH) a southbridge, and a root controller/hub. Often the term chipset refers to two physically separate controller hubs, i.e. a memory controller hub (MCH) coupled to an interconnect controller hub (ICH). Note that current systems often include the MCH integrated with processor 105, while controller 115 is to communicate with I/O devices, in a similar manner as described below. In some embodiments, peer-to-peer routing is optionally supported through root complex 115.

Here, controller hub 115 is coupled to switch/bridge 120 through serial link 119. Input/output modules 117 and 121, which may also be referred to as interfaces/ports 117 and 121, include/implement a layered protocol stack to provide communication between controller hub 115 and switch 120. In one embodiment, multiple devices are capable of being coupled to switch 120.

Switch/bridge 120 routes packets/messages from device 125 upstream, i.e. up a hierarchy towards a root complex, to controller hub 115 and downstream, i.e. down a hierarchy away from a root controller, from processor 105 or system memory 110 to device 125. Switch 120, in one embodiment, is referred to as a logical assembly of multiple virtual PCI-to-PCI bridge devices. Device 125 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 125 may include a PCIe to PCI/PCI-X bridge to support legacy or other version PCI devices. Endpoint devices in PCIe are often classified as legacy, PCIe, or root complex integrated endpoints.

Graphics accelerator 130 is also coupled to controller hub 115 through serial link 132. In one embodiment, graphics accelerator 130 is coupled to an MCH, which is coupled to an ICH. Switch 120, and accordingly I/O device 125, is then coupled to the ICH. I/O modules 131 and 118 are also to implement a layered protocol stack to communicate between graphics accelerator 130 and controller hub 115. Similar to the MCH discussion above, a graphics controller or the graphics accelerator 130 itself may be integrated in processor 105. Further, one or more links (e.g., 123) of the system can include one or more extension devices (e.g., 150), such as retimers, repeaters, etc.

Figure 2:
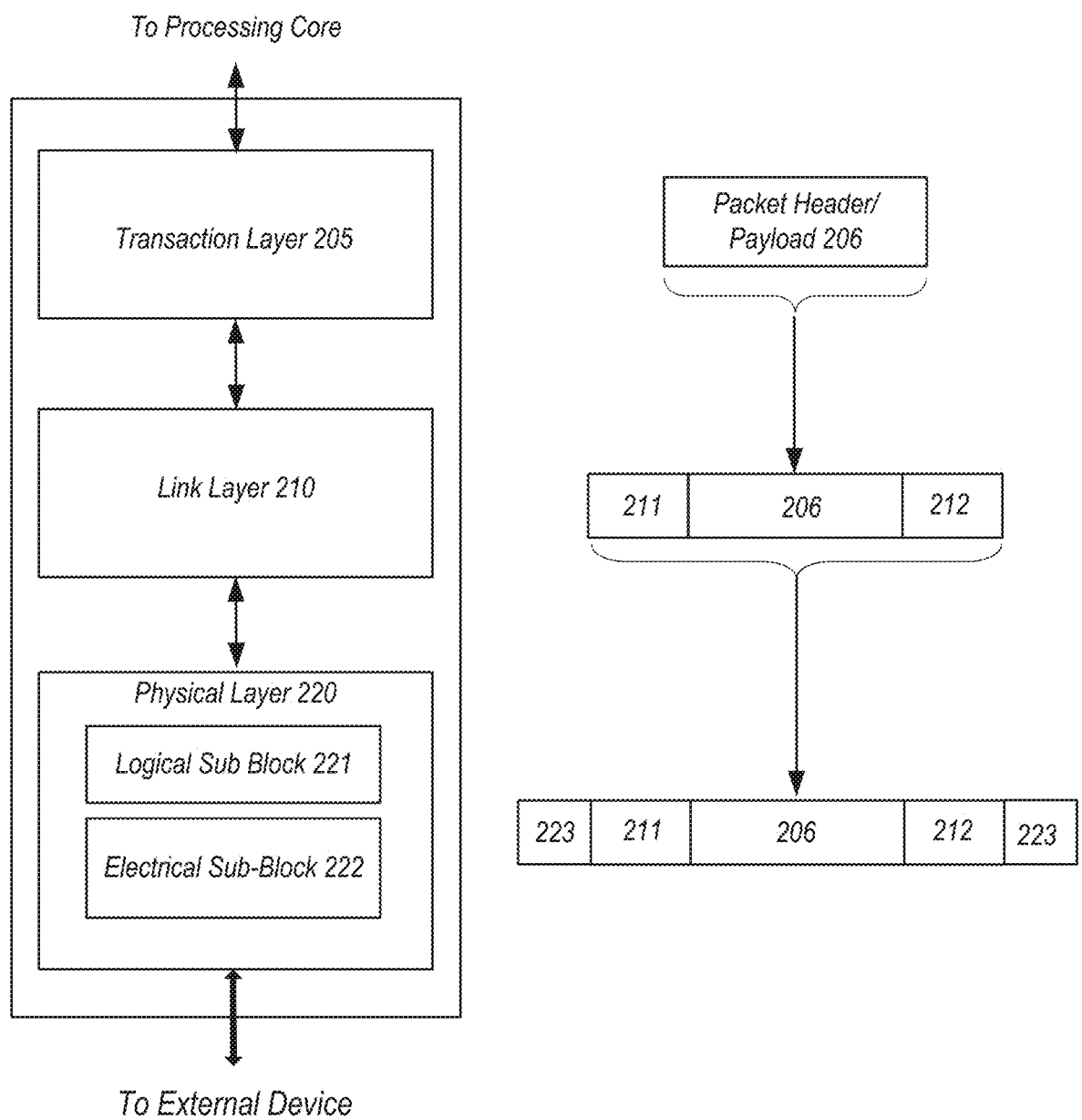
FIG. 2 illustrates an embodiment of a interconnect architecture including a layered stack.

Turning to FIG. 2 an embodiment of a layered protocol stack is illustrated. Layered protocol stack 200 includes any form of a layered communication stack, such as a Quick Path Interconnect (QPI) stack, a PCIe stack, a Compute Express Link (CXL) stack, or other high performance computing interconnect stack, or other layered stack. Although the discussion immediately below in reference to FIGS. 1-4 are in relation to a general purpose interconnect protocol stack (e.g., PCIe), the same concepts may be applied to other interconnect stacks. In one embodiment, protocol stack 200 is a protocol stack including transaction layer 205, link layer 210, and physical layer 220. An interface, such as interfaces 117, 118, 121, 122, 126, and 131 in FIG. 1, may be represented as communication protocol stack 200. Representation as a communication protocol stack may also be referred to as a module or interface implementing/including a protocol stack.

A protocol may use packets to communicate information between components. Packets are formed in the Transaction Layer 205 and Data Link Layer 210 to carry the information from the transmitting component to the receiving component. As the transmitted packets flow through the other layers, they are extended with additional information necessary to handle packets at those layers. At the receiving side the reverse process occurs and packets get transformed from their Physical Layer 220 representation to the Data Link Layer 210 representation and finally (for Transaction Layer Packets) to the form that can be processed by the Transaction Layer 205 of the receiving device.

Transaction Layer

In one embodiment, transaction layer 205 is to provide an interface between a device's processing core and the interconnect architecture, such as data link layer 210 and physical layer 220. In this regard, a primary responsibility of the transaction layer 205 is the assembly and disassembly of packets (i.e., transaction layer packets, or TLPs). The translation layer 205 typically manages credit-base flow control for TLPs. For instance, a protocol may implement split transactions, i.e. transactions with request and response separated by time, allowing a link to carry other traffic while the target device gathers data for the response. In some implementations, flow control may be implemented using a credit-based flow control scheme. In this scheme, a device advertises an initial amount of credit for each of the receive buffers in Transaction Layer 205. An external device at the opposite end of the link, such as controller hub 115 in FIG. 1, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the devices supporting the protocol. Transactions to the configuration space include read requests and write requests. Message space transactions (or, simply messages) are defined to support in-band communication between protocol agents implementing the protocols on the devices. Therefore, in one embodiment, transaction layer 205 assembles packet header/payload 206.

Link Layer

Link layer 210, also referred to as data link layer 210, acts as an intermediate stage between transaction layer 205 and the physical layer 220. In one embodiment, a responsibility of the data link layer 210 is providing a reliable mechanism for exchanging Transaction Layer Packets (TLPs) between two components a link. One side of the Data Link Layer 210 accepts TLPs assembled by the Transaction Layer 205, applies packet sequence identifier 211, i.e. an identification number or packet number, calculates and applies an error detection code, i.e. CRC 212, and submits the modified TLPs to the Physical Layer 220 for transmission across a physical to an external device.

Physical Layer

In one embodiment, physical layer 220 includes logical sub block 221 and electrical sub-block 222 to physically transmit a packet to an external device. Here, logical sub-block 221 is responsible for the "digital" functions of Physical Layer 221. In this regard, the logical sub-block includes a transmit section to prepare outgoing information for transmission by physical sub-block 222, and a receiver section to identify and prepare received information before passing it to the Link Layer 210.

Physical block 222 includes a transmitter and a receiver. The transmitter is supplied by logical sub-block 221 with symbols, which the transmitter serializes and transmits onto to physical transmission medium connecting the transmitter to another external device. The receiver is supplied with serialized symbols from an external device and transforms the received signals into a bit-stream. The bit-stream is de-serialized and supplied to logical sub-block 221. In one embodiment, an 8b/10b transmission code is employed, where ten-bit symbols are transmitted/received. In other instances, a 128b/130b encoding may be employed, while in still other implementations, flit-based transmission may be utilized, among other examples. In one example, special symbols are used to frame a packet with frames 223. In addition, in one example, the receiver also provides a symbol clock recovered from the incoming serial stream.

A transmission medium may implement a transmission path for transmitting data, such as a transmission line, a copper line, an optical line, a wireless communication channel, an infrared communication link, or other communication path. A connection between two devices, is referred to as a link. A link may be implemented using one or multiple constituent transmission paths, or lanes. To scale bandwidth, a link may aggregate multiple lanes denoted by xN, where N is any supported Link width, such as 1, 2, 4, 8, 12, 16, 32, 64, or wider. In some implementations, differential signaling may be employed, with a differential pair referring to two transmission paths to transmit differential signals. As an example, in a differential pair, when a first line in the pair toggles from a low voltage level to a high voltage level, i.e. a rising edge, the other line in the pair drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

As stated above, although transaction layer 205, link layer 210, and physical layer 220 are discussed in reference to a specific embodiment (e.g., a traditional PCIe protocol stack), a layered protocol stack is not so limited. In fact, any layered protocol may be included/implemented. As an example, an port/interface may include logic implemented in hardware circuitry and/or firmware to implement various layers in a layered protocol, such as: (1) a first layer to assemble packets (e.g., a transaction or protocol layer); a second layer to sequence packets (e.g., a link or data link layer); and a third layer to transmit the packets (e.g., a physical layer), including layers of protocols discussed more particularly below.

In some implementations, interconnect protocols may implement cache-coherent links. As one example, Ultra Path Interconnect™ (UPI™) may be utilized in high performance computing platforms, such as workstations or servers, including in systems where PCIe or another interconnect protocol is typically used to connect processors, accelerators, I/O devices, and the like. However, UPI is not so limited. Instead, UPI may be utilized in any of the systems or platforms described herein. Furthermore, the individual ideas developed may be applied to other interconnects and platforms, such as PCIe, MIPI, QPI, etc.

Figure 3:
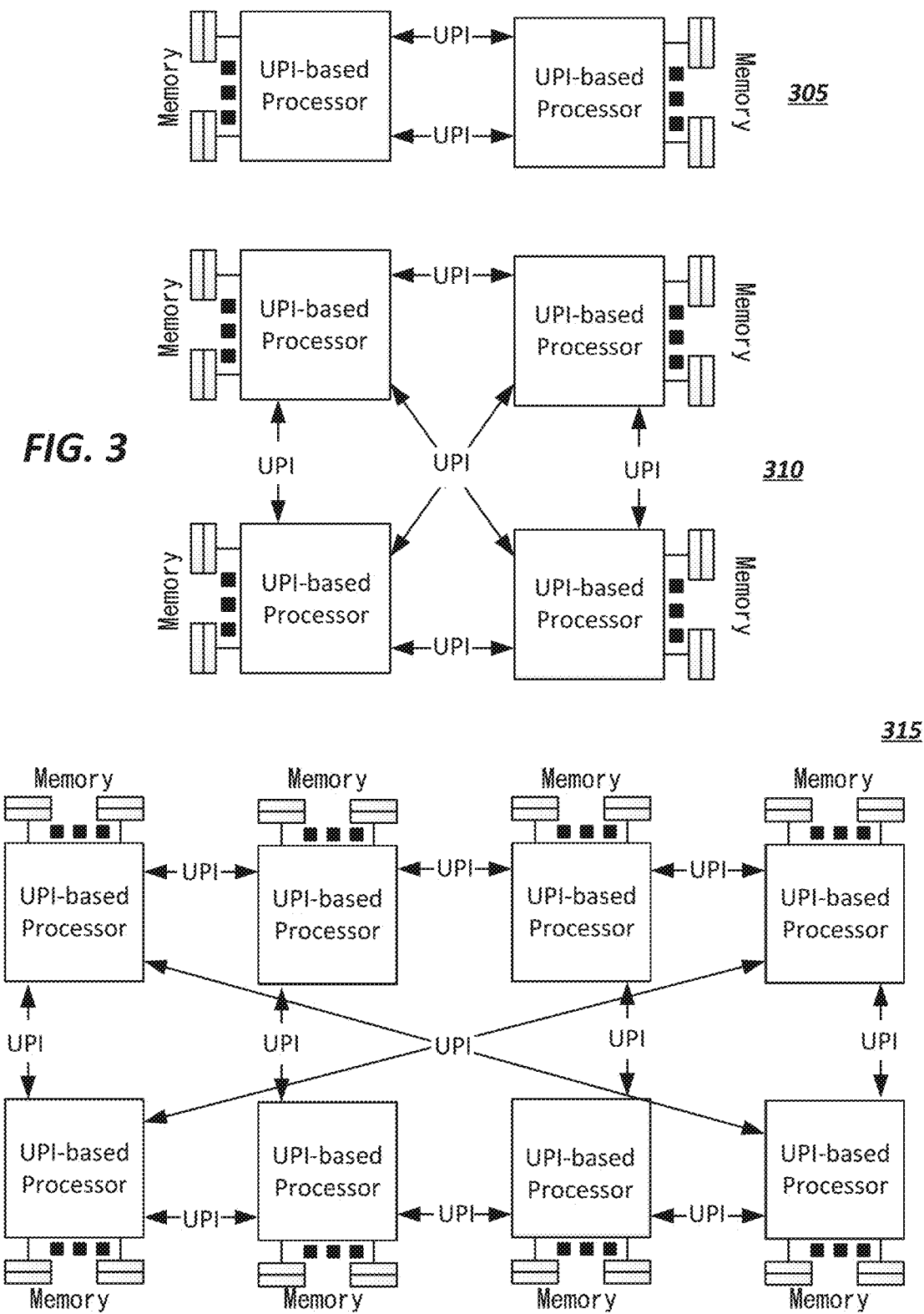
FIG. 3 illustrates embodiments of potential high performance, processor-to-processor interconnect configurations.

To support multiple devices, in one example implementation, UPI can be Instruction Set Architecture (ISA) agnostic (i.e. UPI is able to be implemented in multiple different devices). In another scenario, UPI may also be utilized to connect high performance I/O devices, not just processors or accelerators. For example, a high performance PCIe device may be coupled to UPI through an appropriate translation bridge (i.e. UPI to PCIe). Moreover, the UPI links may be utilized by many UPI based devices, such as processors, in various ways (e.g. stars, rings, meshes, etc.). Indeed, interconnect protocols, such as UPI and others discussed herein, may be used to facilitate interconnections between dies or packages. For instance, FIG. 3 illustrates example implementations of various potential multi-socket configurations. A two-socket configuration 305, as depicted, can include two links; however, in other implementations, one link may be utilized. For larger topologies, any configuration may be utilized as long as an identifier (ID) is assignable and there is some form of virtual path, among other additional or substitute features. As shown, in one example, a four socket configuration 310 has a link from each processor to another. But in the eight socket implementation shown in configuration 315, not every socket is directly connected to each other through a respective link. However, if a virtual path or channel exists between the processors, the configuration is supported. A range of supported processors includes 2-32 in a native domain. Higher numbers of processors may be reached through use of multiple domains or other interconnects between node controllers, among other examples.

As with other interconnect architectures, the UPI architecture includes a definition of a layered protocol architecture, including in some examples, protocol layers (coherent, non-coherent, and, optionally, other memory based protocols), a routing layer, a link layer, and a physical layer. In some implementations, respective layers in the protocol stack may construct and/or deal with their own level of granularity or quantum of information (e.g., the protocol layer with packets, the link layer with flits, the physical layer with phits or symbols, among other examples) Note that a packet, in some embodiments, may include partial flits, a single flit, or multiple flits based on the implementation.

In another example interconnect protocol, a Compute Express Link (CXL) interconnect protocol may be utilized to provide an improved, high-speed CPU-to-device and CPU-to-memory interconnect designed to accelerate next-generation data center performance, among other application. CXL maintains memory coherency between the CPU memory space and memory on attached devices, which allows resource sharing for higher performance, reduced software stack complexity, and lower overall system cost, among other example advantages. CXL enables communication between host processors (e.g., CPUs) and a set of workload accelerators (e.g., graphics processing units (GPUs), field programmable gate array (FPGA) devices, tensor and vector processor units, machine learning accelerators, purpose-built accelerator solutions, among other examples). Indeed, CXL is designed to provide a standard interface for high-speed communications, as accelerators are increasingly used to complement CPUs in support of emerging computing applications such as artificial intelligence, machine learning and other applications.

A CXL link may be a low-latency, high-bandwidth discrete or on-package link that supports dynamic protocol multiplexing of coherency, memory access, and input/output (I/O) protocols. Among other applications, a CXL link may enable an accelerator to access system memory as a caching agent and/or host system memory, among other examples. CXL is a dynamic multi-protocol technology designed to support a vast spectrum of accelerators. CXL provides a rich set of protocols that include I/O semantics similar to PCIe (CXL.io), caching protocol semantics (CXL.cache), and memory access semantics (CXL.mem) over a discrete or on-package link. Based on the particular accelerator usage model, all of the CXL protocols or only a subset of the protocols may be enabled. In some implementations, CXL may be built upon the well-established, widely adopted PCIe infrastructure (e.g., PCIe 5.0), leveraging the PCIe physical and electrical interface to provide advanced protocol in areas include I/O, memory protocol (e.g., allowing a host processor to share memory with an accelerator device), and coherency interface.

Figure 4:
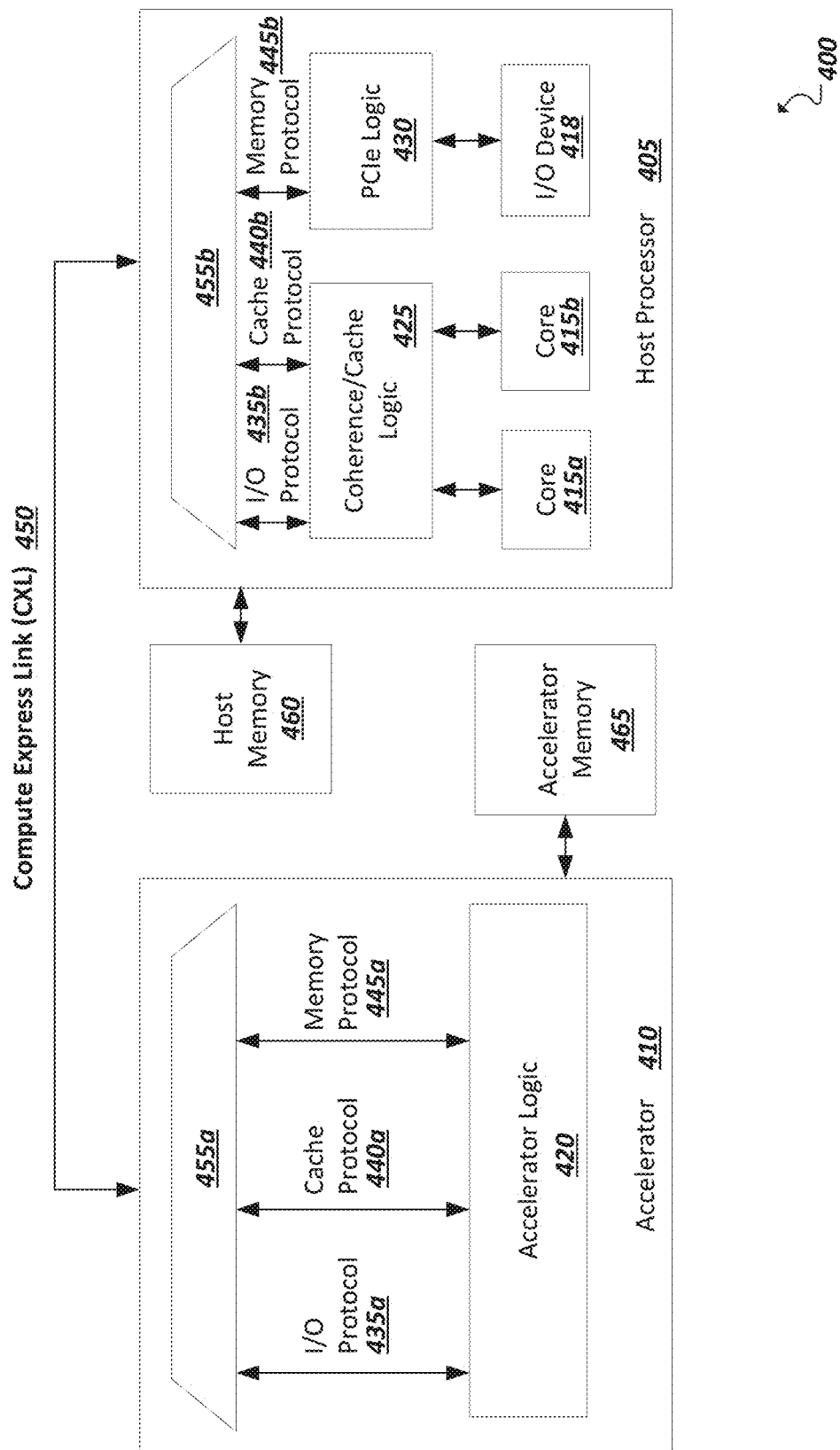
FIG. 4 illustrates an embodiment of a layered protocol stack associated with an interconnect.

Turning to FIG. 4, a simplified block diagram 400 is shown illustrating an example system utilizing a CXL link 450. For instance, the link 450 may interconnect a host processor 405 (e.g., CPU) to an accelerator device 410. In this example, the host processor 405 includes one or more processor cores (e.g., 415*a-b*) and one or more I/O devices (e.g., 418). Host memory (e.g., 460) may be provided with the host processor (e.g., on the same package or die). The accelerator device 410 may include accelerator logic 420 and, in some implementations, may include its own memory (e.g., accelerator memory 465). In this example, the host processor 405 may include circuitry to implement coherence/cache logic 425 and interconnect logic (e.g., PCIe logic 430). CXL multiplexing logic (e.g., 455*a-b*) may also be provided to enable multiplexing of CXL protocols (e.g., I/O protocol 435*a-b* (e.g., CXL.io), caching protocol 440*a-b* (e.g., CXL.cache), and memory access protocol 445*a-b* (CXL.mem)), thereby enabling data of any one of the supported protocols (e.g., 435*a-b*, 440*a-b*, 445*a-b*) to be sent, in a multiplexed manner, over the link 450 between host processor 405 and accelerator device 410.

In some implementations of CXL, a Flex Bus port may be utilized in concert with CXL-compliant links to flexibly adapt a device to interconnect with a wide variety of other devices (e.g., other processor devices, accelerators, switches, memory devices, etc.). A Flex Bus port is a flexible high-speed port that is statically configured to support either a PCIe or CXL link (and potentially also links of other protocols and architectures). A Flex Bus port allows designs to choose between providing native PCIe protocol or CXL over a high-bandwidth, off-package link. Selection of the protocol applied at the port may happen during boot time via auto negotiation and be based on the device that is plugged into the slot. Flex Bus uses PCIe electricals, making it compatible with PCIe retimers, and adheres to standard PCIe form factors for an add-in card.

Figure 5:
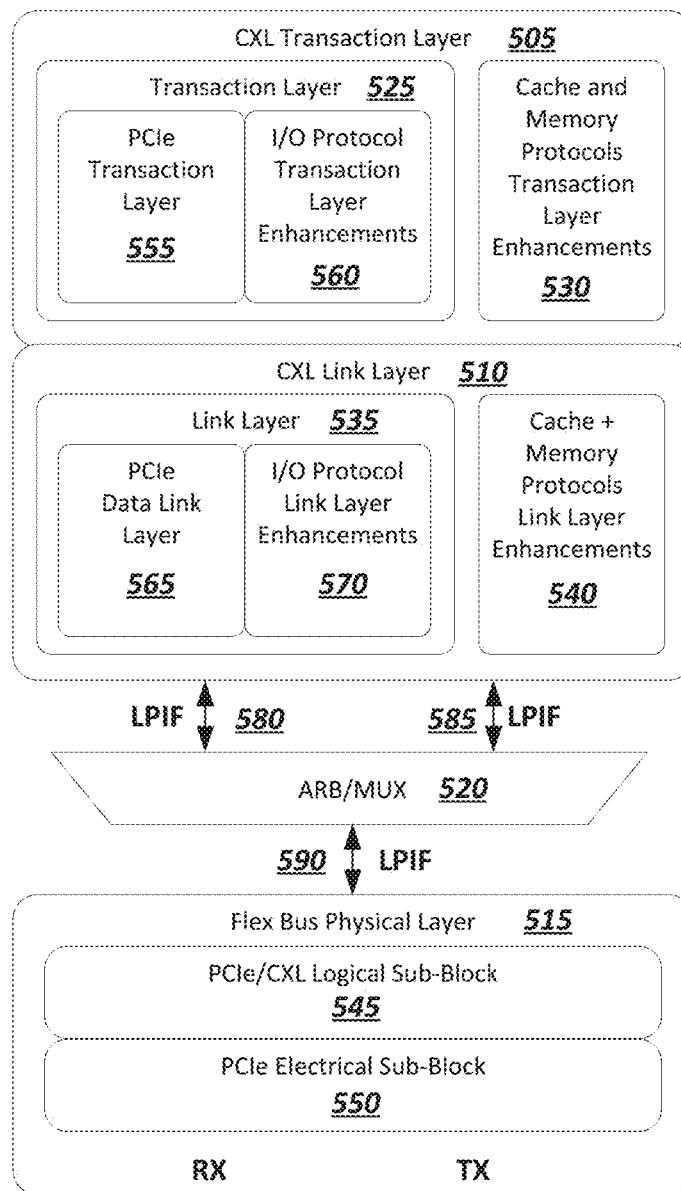
FIG. 5 illustrates a simplified block diagram of an example computing system utilizing a link compliant with a Compute Express Link (CXL)-based protocol.

FIG. 5 is a simplified block diagram illustrating an example port architecture 500 (e.g., Flex Bus) utilized to implement CXL links. For instance, Flex Bus architecture may be organized as multiple layers to implement the multiple protocols supported by the port. For instance, the port may include transaction layer logic (e.g., 505), link layer logic (e.g., 510), and physical layer logic (e.g., 515) (e.g., implemented all or in-part in circuitry). For instance, a transaction (or protocol) layer (e.g., 505) may be subdivided into transaction layer logic 525 that implements a PCIe transaction layer 555 and CXL transaction layer enhancements 560 (for CXL.io) of a base PCIe transaction layer 555, and logic 530 to implement cache (e.g., CXL.cache) and memory (e.g., CXL.mem) protocols for a CXL link. Similarly, link layer logic 535 may be provided to implement a base PCIe data link layer 565 and a CXL link layer (for CXl.io) representing an enhanced version of the PCIe data link layer 565. A CXL link layer 510 may also include cache and memory link layer enhancement logic 540 (e.g., for CXL.cache and CXL.mem).

Continuing with the example of FIG. 5, a CXL link layer logic 510 may interface with CXL arbitration/multiplexing (ARB/MUX) logic 520, which interleaves the traffic from the two logic streams (e.g., PCIe/CXL.io and CXL.cache/CXL.mem), among other example implementations. During link training, the transaction and link layers are configured to operate in either PCIe mode or CXL mode. In some instances, a host CPU may support implementation of either PCIe or CXL mode, while other devices, such as accelerators, may only support CXL mode, among other examples. In some implementations, the port (e.g., a Flex Bus port) may utilize a physical layer 515 based on a PCIe physical layer (e.g., PCIe electrical PHY 550). For instance, a Flex Bus physical layer may be implemented as a converged logical physical layer 545 that can operate in either PCIe mode or CXL mode based on results of alternate mode negotiation during the link training process. In some implementations, the physical layer may support multiple signaling rates (e.g., 8 GT/s, 16 GT/s, 32 GT/s, etc.) and multiple link widths (e.g., x16, x8, x4, x2, x1, etc.). In PCIe mode, links implemented by the port 500 may be fully compliant with native PCIe features (e.g., as defined in the PCIe specification), while in CXL mode, the link supports all features defined for CXL. Accordingly, a Flex Bus port may provide a point-to-point interconnect that can transmit native PCIe protocol data or dynamic multi-protocol CXL data to provide I/O, coherency, and memory protocols, over PCIe electricals, among other examples.

The CXL I/O protocol, CXL.io, provides a non-coherent load/store interface for I/O devices. Transaction types, transaction packet formatting, credit-based flow control, virtual channel management, and transaction ordering rules in CXL.io may follow all or a portion of the PCIe definition. CXL cache coherency protocol, CXL.cache, defines the interactions between the device and host as a number of requests that each have at least one associated response message and sometimes a data transfer. The interface consists of three channels in each direction: Request, Response, and Data.

The CXL memory protocol, CXL.mem, is a transactional interface between the processor and memory and uses the physical and link layers of CXL when communicating across dies. CXL.mem can be used for multiple different memory attach options including when a memory controller is located in the host CPU, when the memory controller is within an accelerator device, or when the memory controller is moved to a memory buffer chip, among other examples. CXL.mem may be applied to transaction involving different memory types (e.g., volatile, persistent, etc.) and configurations (e.g., flat, hierarchical, etc.), among other example features. In some implementations, a coherency engine of the host processor may interface with memory using CXL.mem requests and responses. In this configuration, the CPU coherency engine is regarded as the CXL.mem Master and the Mem device is regarded as the CXL.mem Subordinate. The CXL.mem Master is the agent which is responsible for sourcing CXL.mem requests (e.g., reads, writes, etc.) and a CXL.mem Subordinate is the agent which is responsible for responding to CXL.mem requests (e.g., data, completions, etc.). When the Subordinate is an accelerator, CXL.mem protocol assumes the presence of a device coherency engine (DCOH). This agent is assumed to be responsible for implementing coherency related functions such as snooping of device caches based on CXL.mem commands and update of metadata fields. In implementations, where metadata is supported by device-attached memory, it can be used by the host to implement a coarse snoop filter for CPU sockets, among other example uses.

In some implementations, an interface may be provided to couple circuitry or other logic (e.g., an intellectual property (IP) block or other hardware element) implementing a link layer (e.g., 510) to circuitry or other logic (e.g., an IP block or other hardware element) implementing at least a portion of a physical layer (e.g., 515) of a protocol. For instance, an interface based on a Logical PHY Interface (LPIF) specification to define a common interface between a link layer controller, module, or other logic and a module implementing a logical physical layer ("logical PHY" or "logPHY") to facilitate interoperability, design and validation re-use between one or more link layers and a physical layer for an interface to a physical interconnect, such as in the example of FIG. 5. Additionally, as in the example of FIG. 5, an interface may be implemented with logic (e.g., 535, 540) to simultaneously implement and support multiple protocols. Further, in such implementations, an arbitration and multiplexer layer (e.g., 520) may be provided between the link layer (e.g., 510) and the physical layer (e.g., 515). In some implementations, each block (e.g., 515, 520, 535, 540) in the multiple protocol implementation may interface with other block via an independent LPIF interface (e.g., 580, 585, 990). In cases where bifurcation is supported, each bifurcated port may likewise have its own independent LPIF interface, among other examples.

While examples discussed herein may reference the use of LPIF-based link layer-logical PHY interfaces, it should be appreciated that the details and principles discussed herein may be equally applied to non-LPIF interfaces. Likewise, while some examples may reference the use of common link layer-logical PHY interfaces to couple a PHY to controllers implement CXL or PCIe, other link layer protocols may also make use of such interfaces. Similarly, while some references may be made to Flex Bus physical layers, other physical layer logic may likewise be employed in some implementations and make use of common link layer-logical PHY interfaces, such as discussed herein, among other example variations that are within the scope of the present disclosure.

Traditional die-to-die interconnects are either vendor-specific or application specific (e.g., HBM Connect is used to connect memory on-package). Some die-to-die interconnects (e.g., MB from Intel, HBI and BoW from OCP consortium) only define a physical layer and do not provide a mechanism for ensuring interoperability across dies. Indeed, current solutions do not exist for implementing a general-purpose die-to-die interconnect that can be used for seamless interoperability between dies and can provide open innovation slots on the package, which engineers can innovate around. An improved interconnect architecture is introduced herein to implement a standardized die-to-die interface through the Universal Chiplet Interconnect Express (UCIe) protocol. Not only does UCIe enable a solution for general-purpose die-to-die interconnects for the on-package and off-package coupling of dies, but the standardization of the interface enable the interconnection of different devices from different vendors and different fabs across different technology nodes using different packaging choices to improve upon existing computing system and implement new systems.

UCIe offers high-bandwidth, low-latency, power-efficient, and cost-effective on-package connectivity between chiplets. It addresses the projected growing demands of compute, memory, storage, and connectivity across the entire compute continuum spanning cloud, edge, enterprise, 5G, automotive, high-performance computing, and hand-held segments. While Moore's Law has held true, allowing for increasingly compact and powerful computing blocks, the increasing on-package integration of multiple dies in mainstream commercial offerings such as client CPUs, server CPUs, GP-GPUs, etc. has resulted in larger die sizes to meet growing performance demands. This phenomenon, however, has resulted in designs running up against the die reticle limit. Examples include multi-core CPUs with core count in the hundreds or very large fanout switches. Even when a die can fit within the reticle limit, multiple smaller dies connected in a package may be preferable for yield optimization as well as die reuse across multiple market segments. On-package connectivity of identical dies enables these scale-up applications. Additionally, chiplet integration on package also enables a designer to make different trade-offs for different market segments by choosing different numbers and types of dies. For example, one can choose different numbers of compute, memory, and I/O dies depending on the need of the segment. One does not need to do a different die design for different segments, resulting in lower product SKU cost.

On-package integration of chiplets enables a fast and cost-effective way to provide bespoke solutions. For example, different usages may need different acceleration capability but with the same cores, memory, and I/O. It also allows the co-packaging of dies where the optimal process node choice is made based on the functionality. For example, memory, logic, analog, and co-packaged optics each needs a different process technology which can be packaged with chiplets. Since package traces are short and offers dense routing, applications requiring high bandwidth such as memory access (e.g., High Bandwidth Memory), are implemented as on-package integration.

UCIe is an open, multi-protocol capable, on-package interconnect standard for connecting multiple dies on the same package. UCIe enables the development of a vibrant ecosystem supporting disaggregated die architectures which can be interconnected using UCIe. UCIe supports multiple protocols, such as PCIe, CXL, Advanced Extensible Interface™ (AXI), UPI, and other others, as well as a raw mode that can be used to map any protocol of choice (as long as both link partners support it) on top of a common physical and link layer. UCIe may additionally encompass the elements for system on chip (SoC) construction, such as the application layer and the form-factors relevant to the package (e.g., bump location, power delivery, thermal solution, etc.), among other features. The features of UCIe act to ensure interoperability across a wide range of devices having different performance characteristics. A well-defined debug and compliance mechanism is provided to ensure interoperability. UCIe may additionally allow support of devices in a backward compatible manner.

While UCIe supports a wide range of usage models, a subset are provided here as illustrative examples. As noted above, some protocols may be mapped explicitly onto UCIe, such as PCIe and CXL. Such protocols may be mapped onto a UCIe flit format, including the raw mode. As an example, widely used protocols such as PCIe and CXL may be mapped onto UCIe to more on-package integration, for instance, by replacing the PCIe SERDES PHY and the PCIe/CXL Logical PHY along with the link level retry, improve power, and enhance performance, among other example features. UCIe raw mode is protocol-agnostic and enables other protocols to be mapped ad hoc by a device, while allowing usages such as integrating a stand-alone SERDES/transceiver tile (e.g., ethernet) on-package, among other example features.

Figure 6:
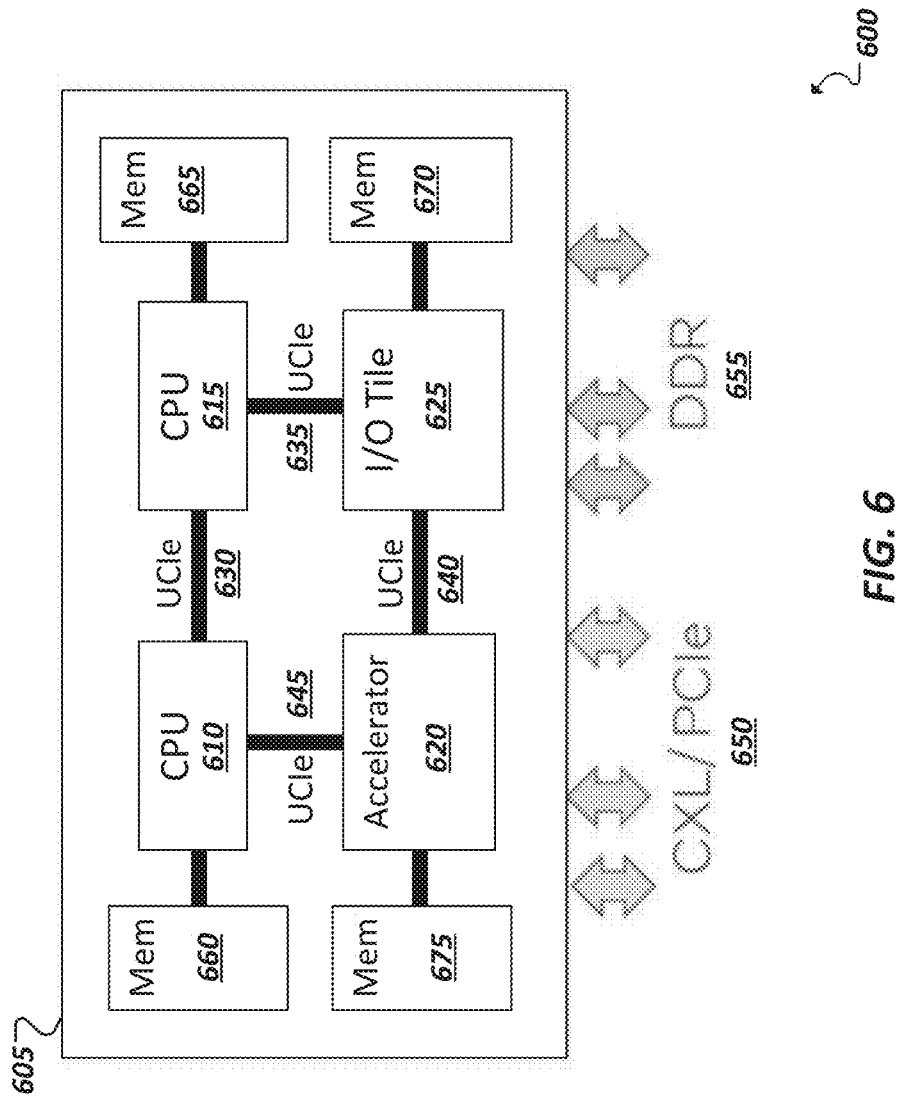
FIG. 6 illustrates a simplified block diagram of an example system on chip (SoC) package.

FIG. 6 is a simplified block diagram 600 illustrating an example implementation of an SoC package 605 including a number of processor dies (e.g., 610, 615), accelerator die(s) (e.g., 620), and input/output (I/O) tiles (e.g., 625) interconnected using a number of UCIe links (e.g., 630, 635, 640, 645). In some implementations, an accelerator 620 and/or I/O tile 625 can be connected to CPU device(s) 610, 615 using CXL transactions running on UCIe to thereby leverage the I/O, coherency, and memory protocols of CXL. The I/O tile can provide the external CXL, PCIe and DDR pins (e.g., 650, 655) of the package 605. The accelerator can also be connected to the CPU using PCIe transactions running on UCIe. The CPU-to-CPU connectivity on-package can also use the UCIe interconnect, running coherency protocols, among other examples. In some implementations, all component on an example SoC package may be interconnected using UCIe links. In other instances, one or more blocks (e.g., memory blocks 660, 665, 670, 675) may be connected using other protocols or links (e.g., DDR, etc.), among other example implementations.

Figure 7:
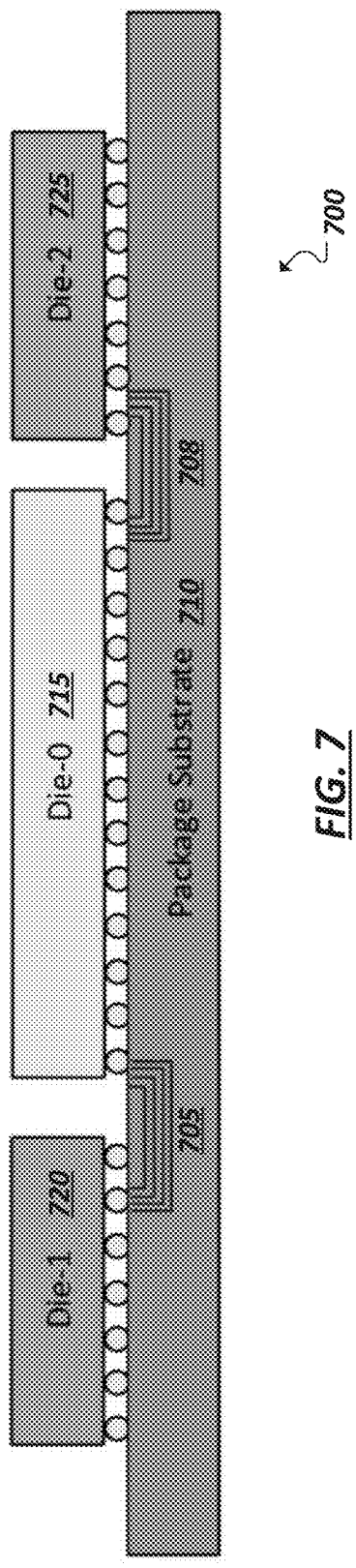
FIG. 7 illustrates simplified block diagram of a two-dimensional package substrate and interconnect coupling two or more device.

A variety of packages may support UCIe links. For instance, a standard two-dimensional (2D) package may be utilized, as well 2.5D and 3D advanced packaging options, among other examples. FIG. 7 is a simplified block diagram illustrating an example application using a standard 2D package. A 2D package may be used for low cost and long reach (e.g., 10 mm to 25 mm) interconnects using traces 705, 708 on organic package/substrate 710, while still providing significantly better BER characteristics compared to off-package SERDES. As shown in FIG. 7, a first die 715 may be coupled to a second die 720 and a third die 725 by respective links implemented using traces (e.g., 705, 708) on the substrate 710.

Figure 8A:
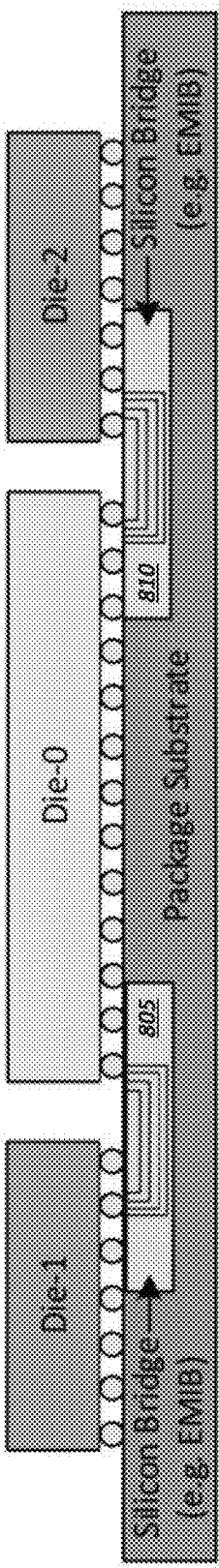

FIGS. 8A-8D are simplified block diagrams 800*a*-*d* showing example applications using a UCIe advanced (e.g., 2D) option. Such packaging technology may be used for performance optimized applications. Consequently, the channel reach is short (e.g., less than 2 mm) and the interconnect is expected to be optimized for high bandwidth and low latency with best performance and power efficiency characteristics. In one example, shown in FIG. 8A, links may be implemented on a silicon bridge 805, 810 (e.g., an Embedded Multi-die Interconnect Bridge (EMIB)). In the example of FIG. 8B, an interposer 815 on the package 710 and UCIe links (e.g., 820, 825) may be provided on the interposer 815

Figure 8D:
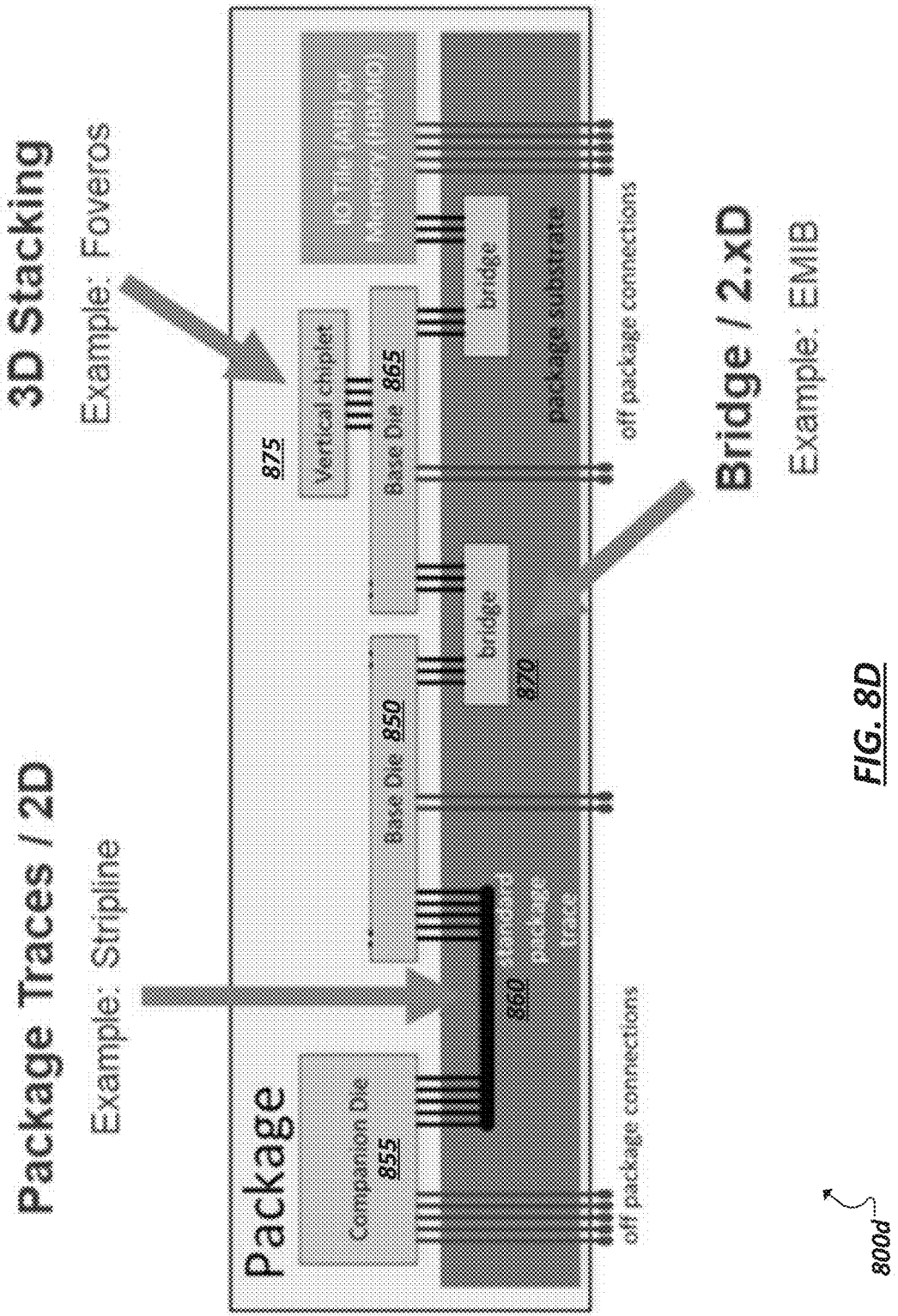

(e.g., in a Chip-on-Wafer-on-Substrate (CoWoS) application). In still another example of an advanced package, shown in FIG. 8C, silicon bridges (e.g., 830, 835) may be provided in a fanout organic interposer 840 which is provided on the package 710, and UCIe link may be implemented in the silicon bridges 830, 835. FIG. 8D shows another example in which a combination of standard and advanced options are employed. For instance, a base die 850 may be coupled to a companion die 855 in a 2D manner by a first link utilizing a standard package trace 860, while the base die 850 is coupled to another base die 865 by a bridge-based link 870. In another example, base die 865 couples via a 3D UCIe link to a vertical chiplet 875, among other example architectures and package applications.

Figure 9:
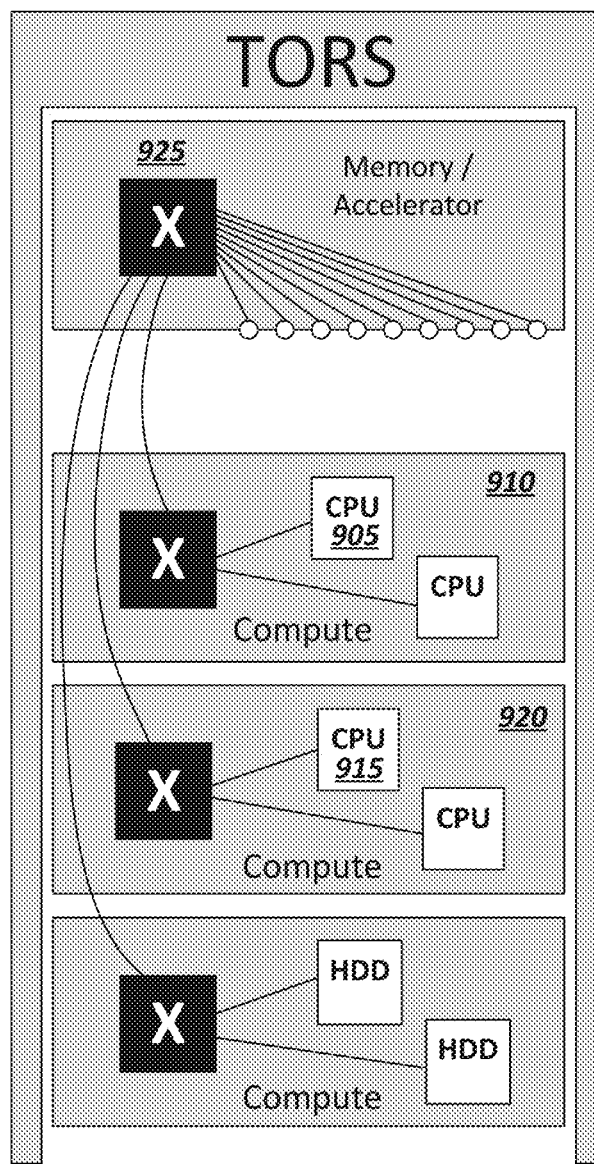
FIG. 9 is a simplified block diagram illustrating an example rack server with interconnected computing devices using a Universal Chiplet Interconnect Express (UCIe)-based protocol.

UCIe supports two broad usage models. The first usage model, as introduced above, involves package level integration to deliver power-efficient and cost-effective performance. Accordingly, components attached at the board level such as memory, accelerators, networking devices, modem, etc. can be integrated at the package level with applicability from hand-held to high-end servers with dies from multiple sources connected through different packaging options even on the same package. The second usage is to provide off-package connectivity using different types of media (e.g., optical, electrical cable, mmWave) using UCIe retimers to transport the underlying protocols (e.g., PCIe, CXL) at the rack or even the pod level for enabling resource pooling, resource sharing, and even message passing using load-store semantics beyond the node level to the rack/pod level to derive better power-efficient and cost-effective performance at the edge and data centers. FIG. 9 is a simplified block diagram showing an example rack server system (e.g., UCIe may be utilized to facilitate off-package connections, including server-scale interconnections between devices. In such implementations, retimers may be provided (e.g., a top of rack server (TORS)) on-package) to facilitate off-package connections. For instance, off-package UCIe links may be utilized to couple a device (e.g., processor device 905) on a first chassis 910 to another device (e.g., processor 915) on another second chassis 920 (e.g., via a switch device 925), among other example implementations.

Figure 10:
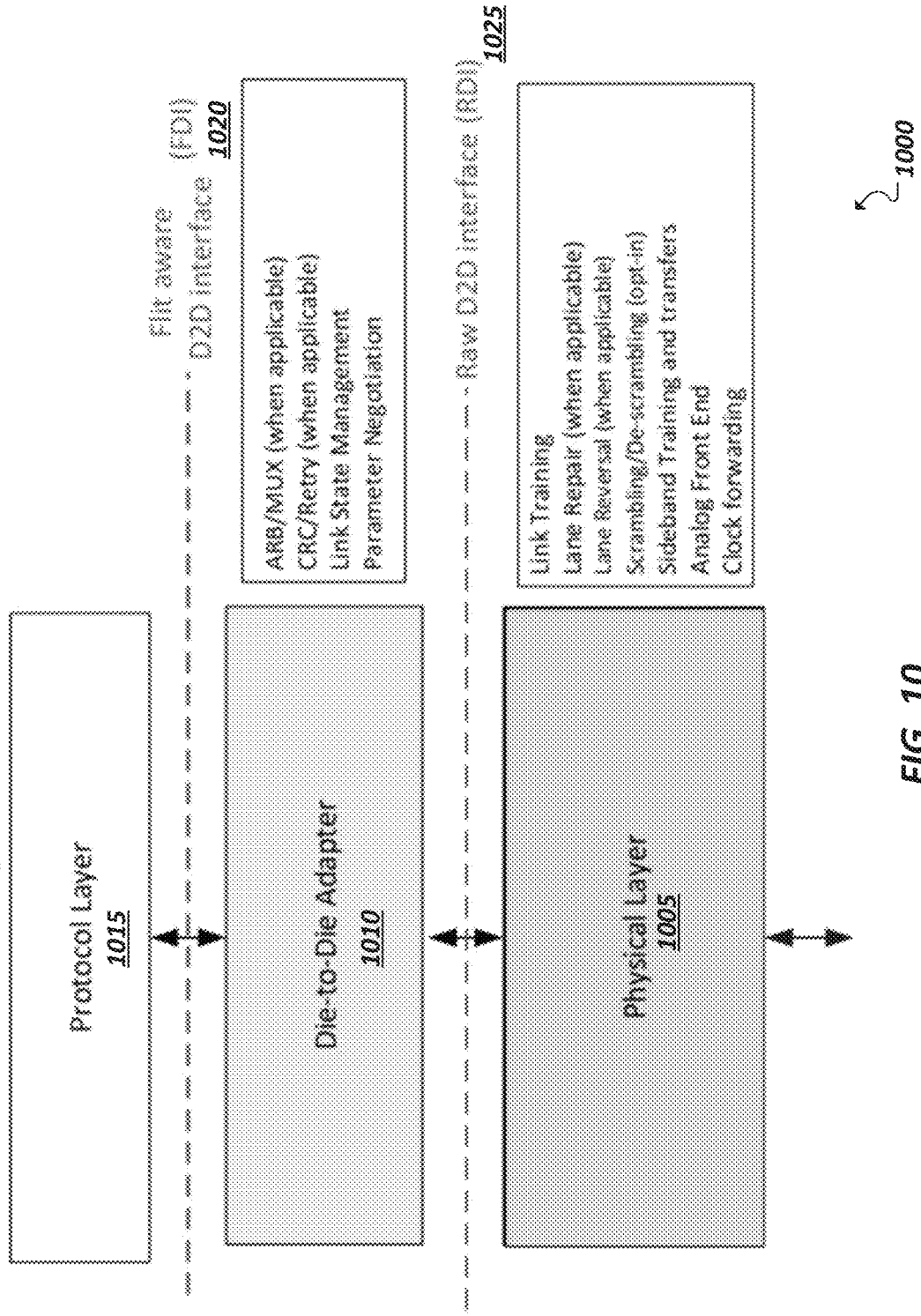
FIG. 10 is a simplified block diagram illustrating an example protocol stack of UCIe.

UCIe is a layered protocol, as illustrated in the block diagram 1000 of FIG. 10. The physical layer 1005 is responsible for the electrical signaling, clocking, link training, and sideband signaling. A die-to-die (D2D) adapter block 1010 provides the link state management and parameter negotiation for the chiplets. It optionally guarantees reliable delivery of data through its cyclic redundancy check (CRC) and link level retry mechanism. When multiple protocols are supported, the D2D adapter defines the underlying arbitration framework for arbitrating between data of the multiple protocols on the link. In one example implementation, UCIe may provide a 256-byte flit (or flow control unit) to define the underlying transfer mechanism when the adapter is responsible for reliable transfer. As noted above, one or more other interconnect protocols may be natively mapped to the flit format of UCIe. In one example, UCIe maps PCIe and CXL protocols to ensure seamless interoperability by leveraging the existing ecosystems of these protocols. For instance, with PCIe and CXL, SoC construction, link management, and security solutions that are already deployed can be leveraged to UCIe. The usage models addressed are also comprehensive: data transfer using direct memory access, software discovery, error handling, etc., are addressed with PCIe/CXL.io; the memory use cases are handled through CXL.Mem; and caching requirements for applications such as accelerators are addressed with CXL.cache, among other example benefits and use cases. UCIe also defines a "streaming protocol" which can be used to map any other protocol onto the flit format(s) defined in UCIe.

A protocol layer 1015 may be according to potentially any interconnect protocol, including protocols natively mapped to UCIe (e.g., CXL, PCIe, etc.), other well-defined or standardized interconnect protocols which can make use of UCIe's streaming or raw modes, or proprietary or vendor-defined protocols (which may likewise make use of UCIe's streaming or raw mode. The protocol layer may implement a transaction layer of the corresponding protocol, implement flow control schemes defined in the protocol, among other protocol-specific features. A logic block implementing the protocol layer 1015 (e.g., in software, firmware, and/or hardware) may interface with a UCIe D2D adapter 1010 using a flit-aware D2D interface (or FDI) 1020 and provide data according to the protocol to the D2D adapter for further processing. Data to be sent on the link using the PHY is received by the PHY from the D2D adapter 1010 over FDI. The FDI interface may be defined in the UCIe protocol specification and define a set of signals for communication and negotiation between the protocol layer block 1015 and D2D adapter block 1010. For instance, signals or messages may defined in the FDI 1020 whereby the D2D adapter 1010 informs the protocol layer (e.g., based on a negotiation with a link partner device (e.g., the D2D adapter of the link partner device)) the flit format to be utilized (e.g., a mapped flit format, streaming mode flit format, raw mode flit format, etc.), which the protocol layer 1015 may use to adapt data of the corresponding protocol for the identified flit format, among other examples.

Through the provision of streaming and raw modes, UCIe allows the option of transporting data of any protocol on a UCIe link. Protocol data can be transported in flit formats, or as raw fabric wires if needed. Some protocols may be explicitly mapped, allowing for on-board components such as accelerators, memory expanders, and I/O expanders to be moved on-package seamlessly. Flit modes include operating modes where error detection and/or error correction bits/bytes (e.g., CRC) are inserted into a defined flit format by the D2D adapter. Flit modes include operating modes where a flit of another, underlying protocol of the data (e.g., PCIe, UPI, CXL, GenZ, AXI, etc.) is mapped onto the UCIe flit format, as well as a streaming mode (where data of potentially any other protocol is encoded or populated into the flit format (e.g., which includes the CRC and any other designated fields defined in the UCIe flit)). Raw mode, on the other hand, is an operating mode where all bytes of the UCIe flit are populated by the protocol layer (and the D2D adapter accepts the flit as-is without adding CRC, Retry, or other values into the flit and transfers data from the protocol layer to the physical layer without any modification). In some instances, CRC, Retry, FEC, etc. in raw mode may be handled entirely by the protocol layer (rather than the UCIe D2D adapter), among other examples.

In some implementations, a D2D adapter 1010 may be provided as a distinct block of circuitry (e.g., from that implementing the protocol layer block and/or the physical layer block 1005). In other implementations, one or both of the logic implementing of the protocol layer or the physical layer may be collocated or integrated with the logic (e.g., hardware circuitry) implementing the D2D adapter block 1010, among other example implementations. A D2D adapter 1010 coordinates with the protocol layer 1015 (e.g., via FDI 1020) and the physical layer 1005 (e.g., via raw D2D interface (RDI) 1025) to ensure successful and reliable data transfer across a UCIe link. Each of these standardized interfaces (e.g., FDI and RDI) may be standardized through a defined set of pins (for physical interconnection of the respective protocol stack blocks), a defined set of signals, states, and state transitions to standardize the way in which the respective protocol stack blocks interact and coordinate. Providing such standardized interfaces (e.g., FDI and RDI) to couple blocks (e.g., IP blocks) implementing respective layers of the protocol allows vendors and SoC builders to easily mix and match different layers from different IP providers at low integration cost and faster time to market. (e.g., enabling a Protocol Layer block to work with the D2D Adapter and Physical Layer block from any different vendor that conforms to the interface handshakes provided in this specification). Further, given that interoperability testing during post-silicon has greater overhead and cost associated with it, a consistent understanding and development of Bus Functional Models (BFMs) based on such interfaces may allow easier IP development for such UCIe protocol stack implementations, among other example benefits.

The D2D adapter 1010 helps facilitate the minimization of logic in the main data path to realize a highly latency-optimized data path for protocol flits. The D2D adapter may include logic to implement various functionality that may be leveraged by various protocols (of protocol layer 1015), such arbitration and multiplexor functionality, error detection and/or error correction codes (e.g., cyclic redundancy check (CRC)), retry scheme, among other example features. As an example, a protocol layer implementing CXL may be coupled to a D2D adapter. When transporting CXL protocol, the ARB/MUX functionality of the D2D adapter 1010 may be utilized to perform arbitration/multiplexing of the multiple sub-protocols of CXL (e.g., CXL.mem, CXL.io, CXL.cache). Error detection, error correction, retry, and other functionality provided by the D2D adapter 1010 may be utilized to support targeted bit error rate (BER) requirements (e.g., based on the speed to be implemented on the link). For instance, where the raw BER is less than 1e-27, a CRC and retry scheme may be provided by the D2D adapter 1010. Additionally, the D2D adapter 1010 may be responsible for coordinating higher level link state machine and link bring up protocols, protocol options related to parameter exchanges with remote link partner, and when supported, power management coordination with remote link partner. For instance, two link partner devices to be coupled using a UCIe link may utilize their respective D2D adapters to perform training of the link (e.g., through the progression through various link states defined in a link state machine) and determination of parameters to be used during operation of the link, among other examples.

A communication port of a computing device may be constructed from a protocol logic block, a D2D adapter block, and a physical layer block. The protocol logic block may interface with the D2D adapter block via a FDI interface and the D2D adapter may interface with the physical layer block using an RDI interface. Each of the FDI and RDI interfaces may be implemented using physical pins, traces, conductors, or other communication pathways, over which the respective signals of the defined interface may be communicated. The protocol logic block (e.g., 1015), D2D adapter block (e.g., 1010), and physical layer block (e.g., 1015) implement respective layers of the UCIe protocol and enable their device to establish a UCIe-compliant link and communicate with another link partner computing device using the UCIe protocol.

The physical layer of a UCIe stack may be implemented through a number of physical layer modules to form the physical layer of a corresponding link. The module forms the main data path (e.g., on the physical bumps or pins of the port) and is organized as a grouping of lanes. A module forms the atomic granularity for the structural design implementation of UCIe's analog front end (AFE). The number of lanes per module may be based on whether a Standard or Advanced package is utilized in the implementations. A single D2D adapter may be coupled to a physical layer implemented as one or multiple modules (for bandwidth scaling). The physical link (and each module making up the physical layer) of UCIe may include a sideband connection (made up of a first subset of the lanes) and a mainband connection made up of a second subset of the lanes of the physical layer). The mainband connection of a UCIe module/physical layer provide the main data path in UCIe. The mainband connection may include a forwarded clock, a data valid pin, and N data lanes per module. The sideband connection is used for parameter exchanges, register accesses for debug/compliance, and coordination with remote partner for link training and management. The sideband connection may include a forwarded clock pin and a data pin in each direction. In one example implementation, a forwarded clock may be fixed at a frequency of 800 MHz regardless of the main data path speed (e.g., at a different frequency than the main data path (mainband) speed). In some implementations, the sideband logic for UCIe's physical layer may be powered using auxiliary power to place the sideband logic in an "always on" domain. Each module may include its own respective set of sideband pins/bumps/lanes.

Figure 11:
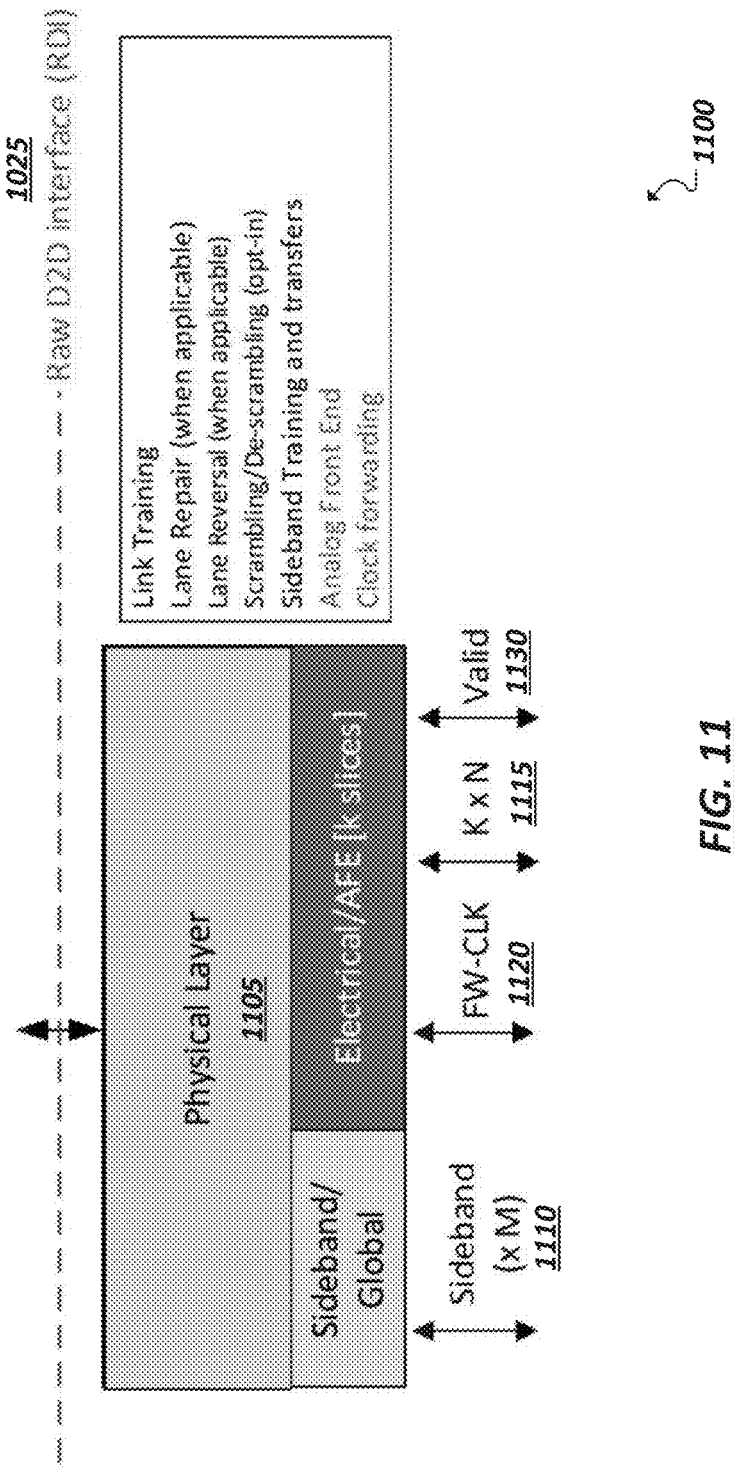
FIG. 11 is a simplified block diagram of an example physical layer block.

FIG. 11 is a simplified block diagram 1100 illustrating an example physical layer block of a UCIe device. The physical layer may include a logical physical layer (logical PHY) 1105, or PHY logic, and a number (M) of sideband lanes 1110 and a number (N) of mainband lanes 1115. As noted above, the mainband lanes may include one or more forward clock lanes 1120, a number of data lanes 1125, and a valid lane 1130. The logical PHY 1105 may perform link training, lane repair, lane reversal, scrambling/descrambling, sideband training and transfers, among other functions for the link. The physical layer may couple to a D2D adapter (e.g., implemented on a separate hardware or IP block) via a RDI interface 1025.

Figure 12C:
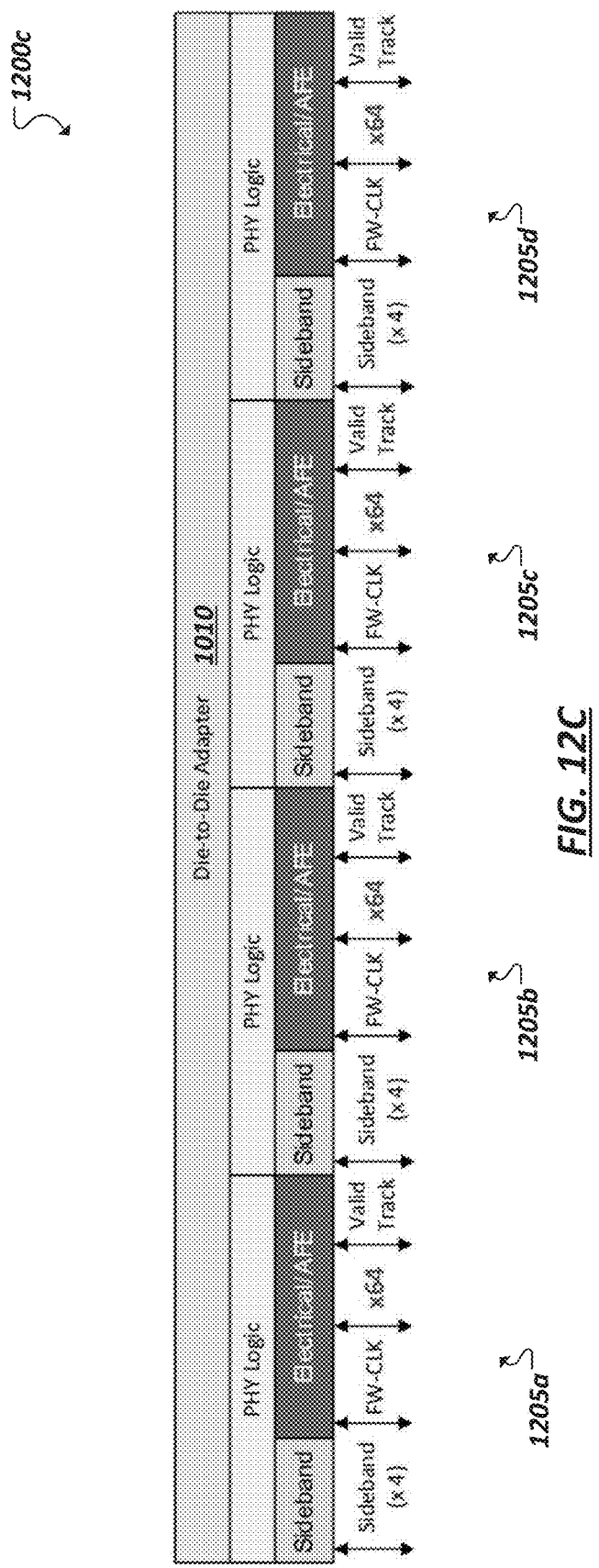

Turning to FIGS. 12A-12C, simplified block diagrams 1200*a*-*c* are shown illustrating example UCIe protocol stacks, where different numbers of PHY modules are utilized to implement the respective physical layer of the UCIe protocol stack. In one example, PHY modules may be defined to each provide 4 sideband lanes 1110, and 64 data lanes 1125. In FIG. 12A, an example implementation is shown where a single module 1205 is used to connect to the D2D adapter 1010 implement the physical layer of the port. FIG. 12B shows another example implementation, where two modules 1205*a*-*b* are utilized to implement the physical layer. Each module 1205*a*-*b* has its own logical PHY (e.g., 1105*a,b*), set of sideband lanes (e.g., 1110*a,b*), and set of mainband lanes (e.g., 1115*a,b*). The use of two modules 1205*a*-*b* effectively doubles the bandwidth of the link as compared to implementations using only a single module, such as in FIG. 12A. The two modules 1205*a*-*b* connect to a single D2D adapter 1010. In still another example, shown in FIG. 12C, a physical layer implementation is shown, constructed using 4 modules 1205*a*-*d* to further scale the bandwidth of the link (e.g., by providing four x64 data lane groupings in each of the 4 modules to form a x320 data width), among other examples (which may include other numbers of defined PHY modules to implement the physical layer for a port).

In accordance with the above, UCIe may support different data rates, widths, bump-pitches, and channel reach to ensure the widest interoperability feasible. The sideband interface is defined for ease of design and validation. Using PHY modules as the unit of construction of the interconnect provides N single-ended, unidirectional, full-duplex data Lanes (e.g., N=16 for standard package and N=64 for advanced package), one single-ended lane for Valid, one lane for tracking, a differential forwarded clock per direction, and four lanes (e.g., 2 per direction) for sideband signaling (e.g., single-ended, one 800 MHz clock and one data). Multiple clusters can be aggregated to deliver more performance per link.

In addition to the features above, an advanced package option in UCIe may be provided to support still additional features. For instance, an advanced package may support spare lanes to handle faulty lanes through pair (e.g., extras lanes for clock, valid, sideband, etc. for repair purposes), whereas the standard package supports width degradation to handle failures. A die with the standard package design may be expected to interoperate with any other design on the standard package. Similarly, a die with the advanced package design may be expected to interoperate with any other die designed for the advanced package (e.g., even within the wide range of bump pitch from 25 u to 55 u). Generally, the standard package (2D) is used for cost-effective performance. The advanced packaging may be used for power-efficient performance. Table 1 below summarizes example key performance targets for an example UCIe implementation:

TABLE 1

Example Key Performance Indicators (KPIs)

| Metric | | Advanced Package | Standard Package |
|---|---|---|---|
| Die Edge Bandwidth Density (GB/s per mm) | 4 GT/s | 165 | 28 |
| | 8 GT/s | 329 | 56 |
| | 12 GT/s | 494 | 84 |
| | 16 GT/s | 658 | 112 |
| | 24 GT/s | 988 | 168 |
| | 32 GT/s | 1317 | 224 |
| Energy Efficiency (pJ/bit) | 0.7 V | 0.5 (<=12 GT/s) 0.6 (>=16 GT/s) — | 0.5 (4 GT/s, short reach) 1.0 (<=16 GT/s, long reach) 1.25 (32 GT/s, long reach) |
| | 0.5 V | 0.25 (<=12 GT/s) 0.3 (>=16 GT/s) | 0.5 (<=16 GT/s, long reach) 0.75 (32 GT/s, long reach) |
| Latency Target | | | <=2 ns |

Where it is assumed that Die Edge Bandwidth Density is with 45 um (Advanced Package) and 110 um (Standard Package) bump pitch, Energy Efficient includes all the PHY-related circuitry (e.g., transmitter, receiver, phase locked loop (PLL), and Latency include the latency of the D2D adapter and the physical layer on the transmitter and receiver, among other examples.

As introduced above, retimers may be used to extend the UCIe connectivity beyond the package using off-package links (e.g., electrical or optical cable communication media), for instance, to connect packages at a rack/pod level. A UCIe retimer implements the UCIe interface to the die that it connects on its local package and ensures that the flits are delivered across the two dies on different packages following the UCIe protocol. UCIe can also be used for transport any protocol including load-store protocols such as PCIe or CXL over long-reach alternate media such as optical. For instance, as one example implementations, a rack/pod-level disaggregation may be implemented using CXL 2.0 (or later) protocol. In this example, at the rack level, multiple compute nodes (e.g., in a virtual hierarchy) from different compute chassis connect to a CXL switch which connects to multiple CXL accelerators and/or Type-3 memory devices which can be placed in one or more separate drawer. In this example, each host may be implemented a compute drawer and each compute drawer connects to the switch using optical connection running CXL protocol through a UCIe-based optical tile. The switch may also have co-package optics where the optical tiles connect to the main switch die using UCIe and on the other side PCIe/CXL physical interconnects are used to connect to the accelerators/memory devices, among numerous other example implementations where UCIe links enable off-package connections.

Figure 13:
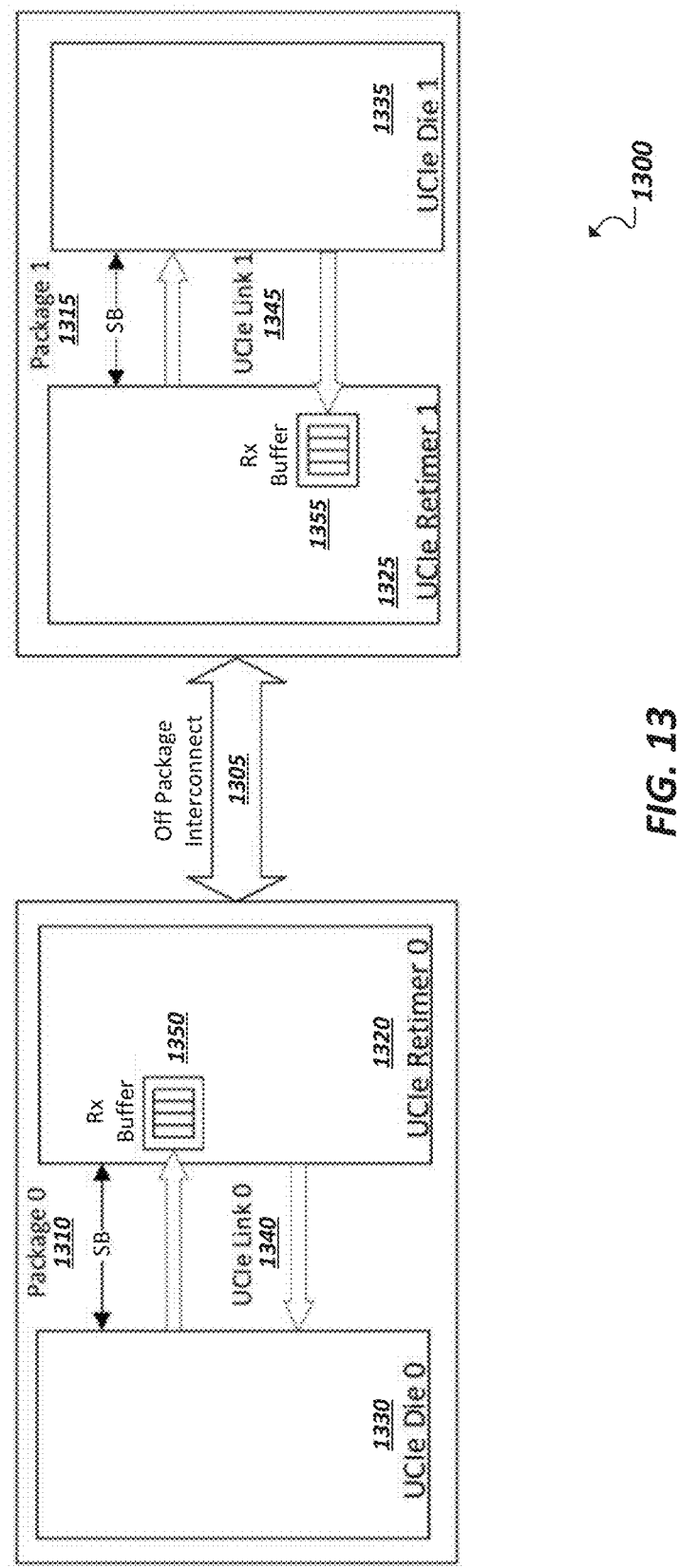
FIG. 13 is a simplified block diagram of a computing system including two packages connected by a UCIe-based interconnect.

Turning to FIG. 13, a simplified block diagram 1300 is shown illustrating an example system including two packages (e.g., 1310, 1315) connected by a UCIe link 1305. As introduced above, UCIe retimers may be used to enable different types of off-package interconnects 1305 to extend the channel reach between two UCIe dies on different packages (e.g., 1310, 1315). A respective UCIe retimer (e.g., 1320, 1325) may be provided at each package to enable the off-package UCIe link (e.g., 1305). Further, each package's UCIe retimer 1320, 1325 may be coupled to one or more of the dies (e.g., 1330, 1335) on its package by a respective UCIe link (e.g., 1340, 1345). The die (e.g., 1330, 1335) may forward data to the corresponding retimer (e.g., 1320, 1325) for communication to the other die on the other package over the off-package link 1305 facilitated through the retimer. Relative to the on-package link (e.g., 1340) coupling the retimer (e.g., 1320) to an on-package die (e.g., 1330), the off-package link may be considerably longer in physical length. The off-package retimer (e.g., 1325) to which the retimer (e.g., 1320) is connected using the off-package link 1305 may be referred to as the "remote retimer partner."

The responsibility of each UCIe retimer (e.g., 1320, 1325) in an example system may include the reliably transport of flits over the off-package interconnect 1305. In one example, the retimer (e.g., 1320, 1325) is configured to implement and support the use of a forward error correct (FEC) and error detection (e.g., cyclic redundancy check (CRC)) natively defined by the underlying specification of the protocol it carries (e.g., PCIe or CXL) as long as the external interconnect conforms to the underlying error model (e.g., BER and error correlation) of the specification corresponding to the protocol it transports. In such an example, the UCIe links may be configured to utilize the raw mode to tunnel native bits of the protocol it transports (e.g., PCIe or CXL flits). In this scenario, the queue sizes (e.g., protocol layer buffers) are adjusted on the UCIe dies to meet the underlying round trip latency. In another example, the retimer may be configured to support and provide the defined FEC, CRC and Retry capabilities to handle the BER of the off-package interconnect. In this case, the flits undergo three independent links; each UCIe retimer performs an independent Ack/Nak for Retry with the UCIe die within its package and a separate independent Ack/Nak for Retry with the remote retimer partner. As another example, the retimer may provide its own FEC by replacing the native protocol's (e.g., PCIe- or CXL) defined FEC with its own, or adding its FEC in addition to the native protocol's defined FEC, but takes advantage of the built-in CRC and Replay mechanisms of the underlying protocol. In this example, the queue sizes (e.g., Protocol Layer buffers, Retry buffers, etc.) must be adjusted on the UCIe dies to meet the underlying round trip latency.

UCIe retimers may also be responsible for the resolution of link layer and protocol layer parameters with its remote retimer partner to ensure interoperability between UCIe dies end-to-end (E2E). For example, retimers (e.g., 1320, 1325) are permitted to force the same link width, speed, protocol (including any relevant protocol specific parameters), and flit formats on both packages (e.g., 1310, 1315). The specific mechanism of resolution, including message transfer for parameter exchanges across the Off Package Interconnect, may be implementation-specific for the retimers and they must ensure a consistent operational mode taking into account their own capabilities along with the UCIe die (e.g., 1330, 1335) capabilities on both packages (e.g., 1310, 1315). However, for robustness of the UCIe links (e.g., 1340, 1345) and to avoid unnecessary timeouts in case the external interconnect 1305 requires a longer time to link up or resolution of parameters with remote retimer partner, a "Stall" response may be defined to the relevant sideband messages that can potentially get delayed. The retimers can respond with the "Stall" response (e.g., according to specification-defined rules) to avoid such unnecessary timeouts while waiting for, or negotiating with, its remote retimer partner. It is the responsibility of the retimer to ensure the UCIe link is not stalled indefinitely. As another feature, UCIe retimers (e.g., 1320, 1325) may be responsible for managing link states defined for the D2D adapter (e.g., an Adapter Link State Machine (LSM)) or the RDI states with its remote retimer partner to ensure correct E2E operation, among other example considerations.

Retimers may additionally provide flow control and back pressure management logic to manage data transmitted from its on-package UCIe die (e.g., 1330, 1335). For instance, data transmitted from a UCIe die to a UCIe retimer may be flow-controlled using credits. Credits used to manage this link (e.g., 1340, 1345) may be in addition to any credit protocol defined for the underlying protocol of the data being sent (e.g., PRH, PRD credits in PCIe). UCIe die-to-die (D2D) credits may be defined for flow control across the two UCIe retimers and any data transmitted to the UCIe retimer is to be eventually consumed by the remote UCIe die without any other dependency. A UCIe retimer (e.g., 1320, 1325) may implement a receiver (Rx) buffer (e.g., 1350, 1355) for flits it receives from the UCIe die (e.g., 1330, 1335) within its package. The receiver buffer credits are advertised to the UCIe die during initial parameter exchanges for the D2D adapter, and the UCIe die may be required to not send any data to the UCIe retimer if it does not have a credit for the transmission. In one example implementations, one credit corresponds to 256B of data (including any FEC, CRC etc.). Credit returns, in one example implementation, may be overloaded or encoded on/in the Valid framing signal. Credit counters at the UCIe die may be reassigned to initial advertised value whenever RDI states transition away from Active. A UCIe retimer may drain or dump (as applicable) the data in its receiver buffer before re-entering Active state. In some examples, data transmitted from a UCIe retimer to a UCIe die may not be flow controlled at the D2D adapter level. The UCIe retimer, instead, may have its independent flow-control with the other UCIe retimer if needed, among other example implementations.

A goal of UCIe is to leverage all of the previous software investments made for popular interconnect protocols, such as PCIe and CXL, while still defining the interface in an extensible way for future innovative solutions. To that end, UCIe's software view of the protocol layer may be configured to remain consistent with that associated with the underlying protocol(s) supported by the protocol layer blocks of the port. For example, a host downstream UCIe port with a protocol layer capable of supporting CXL protocols may appear to software as a root port with a CXL DVSEC capability and relevant PCIe capabilities. Similarly, a host downstream port for UCIe that is capable of supporting PCIe protocol only, would appear to software as a root port with relevant PCIe capabilities only. Similarly, all the CXL/PCIe legacy/advanced capabilities defined in a respective underlying protocols specifications may apply to UCIe host and devices as well, among other examples. In the case of streaming protocols, host-side or device-side view of software may be implementation-specific since the underlying protocol being used in the streaming mode may itself be implementation-specific. In some implementations, streaming solutions may leverage the software hooks already in place for supporting CXL and PCIe. In one example implementations, the upstream ports that connect to a UCIe root port can be a PCI Express end point, PCI Express Switch, a CXL 2.0 or above compliant endpoint-device, or a CXL Switch. This allows for a corresponding UCIe solution to be fully backward compatible to pre-UCIe software (e.g., supporting PCIe or CXL).

To enable UCIe-aware software, a formal functionality split between different layers of the UCIe stack is defined (e.g., between protocol layer, D2D adapter, and PHY), and software has visibility into the capabilities of each layer at a per layer basis. Further, link bring-up rules and parameter negotiation are formalized and utilize the sideband messaging channels provided in the layer interfaces (e.g., RDI and FDI) and the PHY modules. Formalizing the link bring up rules and parameter negotiations using sideband messages. Dedicating a sideband channel for all link management/negotiation messages and transactions allows mainband to be optimized for latency. The sideband link is to provide a back-channel for link training and an interface for sideband access of registers of the link partner. It is also used for link management packets and parameter exchanges with remote link partner. The same protocol may also be used for local die sideband accesses over FDI and RDI. The PHY block may be responsible for framing and transporting sideband packets over the UCIe link. Direct sideband access to a remote die can originate from the D2D adapter (e.g., 1010) or the PHY layer block (e.g., 1005). The D2D adapter forwards a remote die sideband access over RDI to the PHY block for framing and transport. Such accesses may include register access requests, completions, or other messages. Link training activities performed by the physical layer may be passed to the D2D adapter through physical layer registers readable by the D2D adapter, which record results of the link training. The D2D adapter may utilize this information post-link training to determine which flit formats/capabilities to be advertised. A layered negotiation flow decouples link layer/flit format optimizations from protocol feature negotiation. This makes it easy to extend this flow to a wide variety of protocols, among other example advantages.

Registers may be defined in the D2D adapter and PHY layer for use during the bringing-up and training of a UCIe link. Such registers may include capability registers (e.g., read-only), control registers (e.g., read-write), and status registers. Such registers may also be utilized to enable software access and control of the UCIe port. In one example implementations, independent registers (e.g., dedicated vendor-specific extended capabilities (DVSEC) registers) may be defined for the D2D adapter and PHY of a port (and software is permitted to use the presence of these independent registers to identify a device as being UCIe). For instance, PCIe DVSEC structures may be utilized.

Turning to FIG. 14, a representation 1400 of a high-level DVSEC structure is illustrated showing an example implementation of a basic capability register set 1400 that is used to operate a UCIe link. Software may use the presence of this DVSEC to differentiate between a UCIe device and other devices (e.g., a standard PCIe or CXL device, a UCIe Root Port and a standard PCIe or CXL Root Port, etc.). In the example of FIG. 14, for instance, a capabilities register 1405, a control register 1410, and status register 1415 may be included within the set of registers.

The D2D adapter capability register may be utilized to reflect the capabilities of the D2D adapter and is used to advertise and negotiate protocol and parameters with a link partner (e.g., with the link partner device's D2D adapter). Information within a D2D capability register may include whether raw mode is supported, whether optimized modes (using spare lanes) are supported, whether CXL supported, whether PCIe is supported, whether retry is supported, whether the D2D adapter is configured to support multiple protocol layer blocks, whether the D2D adapter supports parity or other error detection/correction schemes, whether the D2D adapter supports streaming modes or protocols, among other examples. A PHY capability register may include other information, such as the number of PHY modules included in the PHY, byte mapping used, whether the link is terminated or unterminated, the I/O link speed enabled by the PHY, among other example information.

Generally, capability registers may be implemented as pre-populated, read-only registers to indicate capabilities of the associated D2D adapter or PHY layer block. Software may read the capability register and utilize this information to determine whether these capabilities should be applied (enabled) or disabled. The enabling or disabling of corresponding capabilities may be set by a software- or hardware-implemented controlled in a corresponding control register. The D2D adapter and PHY may utilize the values set in the control register to determine how to proceed in negotiating (e.g., with the remote link partner and/or retimer) the ultimate characteristics and capabilities of the link. The status register may be utilized to set to record and reflect the results of negotiation with the remote link partner. In one example implementations, the PCIe/CXL capabilities implemented in a UCIe D2D adapter are not independently controlled, but leverage the control using existing DVSEC registers defined in CXL specification, among other example implementations.

As noted above, a Protocol Layer block, D2D adapter and/or PHY block may access local registers utilizing the local sideband channel (e.g., of the RDI or FDI interfaces). The Protocol layer block has indirect access to remote die registers using a sideband mailbox mechanism. In some implementations, the mailbox registers (e.g., 1420a-f) reside in the D2D adapter, and it is the responsibility of the D2D adapter to initiate remote die register access requests when it receives the corresponding access trigger for the mailbox register over FDI. In the case of multi-protocol stacks, the D2D adapter tracks which protocol stack sent the original request and routes the completion back to the appropriate protocol stack on FDI. As the Protocol Layer may only be allowed indirect access to remote die registers, and direct access to local die registers, register access requests and completions may be limited to a certain concurrent number (e.g., one) on the FDI interface. In some implementations, sideband requests that expect a response may be subject to a defined timeout (e.g., an 8 ms timeout). In such implementations, a "Stall" encoding may be provided for the relevant packets for retimers, to prevent timeouts if the retimer needs extra time to respond to the request. When stalling for preventing timeouts, it is the responsibility of the retimer to send the corresponding Stall response once every 4 ms. The retimer may also ensure that it does not Stall indefinitely, and escalates a Link Down event after a reasonable attempt to complete resolution that required stalling the requester. If a requester receives a response with a "Stall" encoding, it resets the timeout counter.

In some instances, registers may be fragmented between the different layers, for instance, with certain bits of a given register physically residing in the Protocol Layer block, other bits residing in the D2D adapter, and other bits residing in the PHY block. UCIe may take a hierarchical decoding for these registers. For fragmented registers, if a bit does not physically reside in a given layer, it may implement that bit as Read Only and tied to 0. In such instances, reads would return 0 for those bits from that layer, and writes would have no effect on those bits. As an example, for reads, a Protocol Layer would forward these requests to the D2D adapter on FDI and the Protocol Layer will OR the data responded by the D2D adapter with its local register before responding to software. The D2D adapter may do the same if any bits of that register reside in the PHY layer before responding to the Protocol Layer, among other examples.

Tables 1-5 represent example implementations of registers which may be utilized in implementations of a UCIe port. For instance, Table 1 illustrates an example implementation of a UCIe link capabilities register utilized by software to discover basic characteristics of the UCIe link:

TABLE 1

Example UCIe link capabilities register

| Bit | Attribute | Description |
| --- | --- | --- |
| 0 | Read Only (RO) | Raw_Mode: If set, indicates the Link can support Raw Mode. |
| 3:1 | Hardware Initialized (HWinit) | Max Link Width<br>0 h: x16<br>1 h: x32<br>2 h: x64<br>3 h: x128<br>4 h: x256<br>Others - Reserved |
| 7:4 | HWinit | Max Link Speeds<br>0 h: 4 GT/s<br>1 h: 8 GT/s<br>2 h: 12 GT/s<br>3 h: 16 GT/s<br>4 h: 24 GT/s<br>5 h: 32 GT/s<br>Others: Reserved |
| 8 | RO (Retimers)<br>Rsvd (Others) | Retimer - Set by retimer to indicate it to SW |
| 9 | Rsvd(Retimers)<br>RO (Others) | Multi-stack capable<br>0 - single stack capable<br>1 - multi stack capable |
| 10 | RO | Advanced Packaging<br>0 = Standard package mode for UCIe Link<br>1 = Advanced package mode for UCIe Link |
| 31:11 | Rsvd | Reserved |

Table 2 illustrates an example implementation of a UCIe link control register, in which control bits for the link are to be set:

TABLE 2

Example UCIe link control register

| Bit | Attribute | Description |
|---|---|---|
| 0 | Read-Write (RW) (RP/DSP), HWInit (Others) | Raw_Mode_Enable: If set, enables the Link to negotiate Raw mode during Link training.<br>Default value of this is 0b for RP and firmware/SW sets this bit based on system usage scenario.<br>Switch DSP can set the default via implementation specific mechanisms like straps/FW/etc, to account of system usage scenario (like UCIe retimer). This allows for the DSP Link to train up without Software intervention and be UCIe-unaware OS compatible. |
| 1 | RW(RP/DSP), RO(EP/DSP), Rsvd (Retimer) | Multi-stack enable: When set, multi stack training is enabled else not. In first gen of UCIe, only 2 stacks max are possible.<br>Default is same as 'Multi-stack Capable' bit in UCIe Link Capability register. |
| 5:2 | RW(RP/DSP), Rsvd (Others) | Target Link Width<br>0h: Reserved<br>1h: Reserved<br>2h: x16<br>3h: x32<br>4h: x64<br>5h: x128<br>6h: x256<br>Others are Reserved.<br>Default is same as 'Max Link Width' field in UCIe Link Capability Register |
| 9:6 | RW(RP/DSP), Rsvd (Others | Target Link Speed<br>0h: 4GT/s<br>1h: 8GT/s<br>2h: 12GT/s<br>3h: 16GT/s<br>4h: 24GT/s<br>5h: 32GT/s<br>Others: Reserved<br>Default is same as 'Max Link speed' field in UCIe Link Capability Register |
| 10 | RW, with auto clear (RP/DSP), Rsvd (Others) | Start UCIe Link training - When set to 1, Link training starts with Link Control bits programmed in this register and with the protocol layer capabilities. Bit is automatically cleared when Link training completes with either success or error. The status register captures the final status of the Link training. Note that if the Link is up when this bit is set to 1 from 0, the Link will go<br>through full training through Link_Down state thus resetting everything beneath the Link.<br>Primary usage intended for this bit is for initial Link training out of reset on the host side.<br>Note: For downstream ports of a switch with UCIe, local HW/FW may autonomously initiate Link training after a conventional reset, without waiting for higher level SW to start the training via this bit, to ensure backward compatibility.<br>Default is 0. |
| 11 | RW with auto clear (RP/DSP), Rsvd (Others) | Retrain UCIe Link - When set to 1, Link that is already up (Link_status=up) will be retrained without going through Link_Down state. SW can use this bit to potentially recover from Link errors. If the Link is down (Link_status=down) when this bit is set, there is no effect from this bit being set. SW should use the 'Start Link training' bit in case the Link is down. The Link_status bit in the status register can be read by software to determine whether to use this bit or not. Note that when retrain happens, the Link speed or width can change because of reliability reasons, and it will be captured through the appropriate status bit in the Link Status register.<br>Bit is automatically cleared when Link retraining completes with either success or error (as reported via the appropriate status bits in the Link Status register) or if the Link retrain did not happen at all for the reason stated earlier.<br>Default is 0. |
| 12 | RW | PHY layer Clock gating enable - When set, the dynamic clock gating of the forward clocked is enabled. Otherwise its free running.<br>Default is 1. |
| 31:13 | Rsvd | Reserved |

Table 3 illustrates an example implementation of a UCIe link status register in which status bits for the link are to be set (e.g., during and following negotiations with the link partner):

TABLE 3

Example UCIe link status register

| Bit | Attribute | Description |
| --- | --- | --- |
| 0 | RO | Raw_Mode_Enabled: If set indicates the Adapter negotiated Raw_Mode operation with remote Link partner. This bit is only valid when Link Status bit in this register indicates 'Link Up'. |
| 1 | Rsvd (Retimer), RO (others) | Multi-stack enabled: When set, multi stack training has been enabled with remote training partner. This bit is only valid when Link Status bit in this register indicates 'Link Up'. |
| 6:2 | Rsvd | Reserved |
| 10:7 | RO | Link Width enabled<br>0h: Reserved<br>1h: x8<br>2h : x16<br>3h : x32<br>4h : x64<br>5h : x128<br>6h : x256<br>This has meaning only when Link status bit shows Link is up. |
| 14:11 | RO | Link Speed enabled<br>0h: 4GT/s<br>1h: 8GT/s<br>2h: 12GT/s<br>3h: 16GT/s<br>4h: 24GT/s<br>5h: 32GT/s<br>Others: Reserved<br>This field has meaning only when Link status field shows Link is up |
| 15 | RO | Link Status<br>0 - Link is down.<br>1 - Link is up<br>Transitioning a Link from down to up requires a full Link retraining, which can be achieved using one of these methods<br>1.Start Link training via the bits in the UCIe Link Control register of the upstream device<br>2.Using the protocol layer reset bit associated with the Link, like the SBR bit in the BCTL register of the RP P2P space<br>3.Using the protocol layer Link Disable bit associated with the Link, like the Link Disable bit in the Link CTL register of the PCIe capability register in the RP P2P space, and then releasing the disable.<br>Note if the Link is actively retraining, this bit reflects a value of 1b. |
| 16 | RO | Link Training/Retraining<br>1b - Currently Link is training or retraining<br>0b - Link is not training or retraining |
| 17 | RW(RP/DSP), Rsvd (Others) | Link Status changed<br>1b - Link either transitioned from up to down or down to up.<br>0b - No Link status change since the last time SW cleared this bit |
| 18 | RW (RP/DSP), Rsvd (Others) | HW autonomous BW changed<br>UCIe autonomously changed the Link width or speed to correct Link reliability related issues |
| 19 | RW | Detected UCIe Link correctable error<br>Presence of specific type of correctable error |
| 20 | RW | Detected UCIe Link Uncorrectable Non-fatal error |
| 21 | RW | Detected UCIe Link Uncorrectable Fatal error |
| 31:22 | Rsvd | Reserved |

Table 4 illustrates another example implementation of a UCIe link capabilities register to include identification of support of various optimized modes:

TABLE 4

Example UCIe link capability register

| Bit | Attribute | Description |
| --- | --- | --- |
| 0 | RO | Raw Mode Enabled: If set indicates the D2D Adapter can support Raw Mode. It may be mandatory for all D2D adapters support this capability, but may be disabled by default. |
| 1 | RO | Optimized Mode Three Lanes:: If set, indicates that the D2D adapter can support an optimized mode data path format using 3 spare lanes, as well as CRC and Retry flows (e.g., Retry Capable is to also be set to 1 if this bit is set to 1). |
| 2 | RO | Optimized Mode Two Lanes:: If set, indicates that the D2D adapter can support an optimized mode data path format using 23 spare lanes |
| 3 | RO | CXL Capable: set if FlexBus port capability exists and is enabled for CXL operation |
| 4 | RO | PCIe Capable: If set, indicates that the D2D adapter is enabled for PCIe protocol and the corresponding relevant capabilities |
| 5 | RO | Retry Capable: If set, indicates that the D2D adapter can support CRC and Retry flows |
| 6 | RO | Two Protocol Stacks Capable: If set, indicates that the D2D adapter two Protocol Layers connected to it |
| 7 | RO | Parity Capable: If set, indicates that the D2D adapter can support parity over a spare lane when operating in raw mode |
| 8 | RO | Streaming Capable: If set, indicates that the D2D adapter can support Streaming protocol |
| 15:9 | Rsvd | Reserved |

Table 5 illustrates another example implementation of a UCIe PHY status register, corresponding to the example UCIe link capabilities register represented in Table 4:

TABLE 6

Example UCIe link PHY status register

| Bit | Attribute | Description |
| --- | --- | --- |
| 7:0 | RO | Link Speed enabled<br>4h: 4GT/s<br>8h: 8GT/s<br>Dh: 12GT/s<br>10h: 16GT/s<br>18h: 24GT/s<br>20h: 32GT/s |
| 8 | RO | Three Spare Lanes Ready:: This field is set to 1 if three spare lanes are functional at highest operational speed |
| 9 | RO | Three Spare Lanes Ready:: This field is set to 1 if two spare lanes are functional at highest operational speed (also set to 1 if three spare lanes are functional) |
| 10 | RO | Adapter Retry: This field is set to 1 if the PHY determines that the package configuration and post-training speed is such that the D2D adapter controlled Retry is essential for link operation |
| 15:11 | Rsvd | Reserved |

Table 7 shows an example of a PHY capability register. In some implementations, the PHY layer capability register may be global (in that separate registers are not provided per-module, but for the set of modules making up the PHY):

TABLE 7

Example PHY Capability register

| Bit | Attribute | Description |
| --- | --- | --- |
| 2:0 | RO | Module to Byte mapping<br>00h: no Module reversal (LSB Module to LSB Module)<br>01h: MSB Module to LSB module connectivity<br>Reserved |

TABLE 7-continued

Example PHY Capability register

| Bit | Attribute | Description |
|---|---|---|
| 3 | RO | Terminated Link: If set to 1b, it indicates that the Receiver is terminated. |
| 4 | RO | TX Equalization support:<br>0: TXEQ not supported<br>1: TXEQ supported" |
| 10:5 | RO | Supported Vswing encodings<br>01h: 0.4V<br>02h: 0.45V<br>03h: 0.5V<br>04h: 0.55V<br>05h: 0.6V<br>06h: 0.65V<br>07h: 0.7V<br>08h: 0.75V<br>09h: 0.8V<br>0Ah: 0.85V<br>0Bh: 0.9V<br>0Ch: 0.95V<br>0Dh: 1.0V<br>0Eh: 1.05<br>0Fh: 1.1V<br>10h: 1.15V<br>Others Reserved |
| 12:11 | RO | Clock Mode support:<br>0h: Supports both free running and strobe modes<br>1h: Strobe mode only<br>2h: Free running mode only |
| 14:13 | RO | Clock phase support:<br>0h: Differential clock only<br>1h: Quadrature clock only<br>2h: Both differential and quadrature clock |
| 15 | RO | Package type<br>0h: Advanced Package<br>1h: Standard Package |
| 16 | RO | Tightly coupled mode (TCM) support<br>0h: TCM not Supported<br>1h: TCM supported |
| 31:17 | Rsvd | Reserved |

Table 8 shows an example of a PHY control register. In some implementations, the PHY layer control register may be global for the PHY:

TABLE 8

Example PHY Control Register

| Bit | Attribute | Description |
|---|---|---|
| 2:0 | RW | Module to Byte mapping<br>00h: no Module reversal (LSB Module to LSB Module)<br>01h: MSB Module to LSB module connectivity<br>Others: Reserved<br>Module to Byte mapping hardware writes it post hardware training<br>Default is 0h |
| 3 | RW | Rx Terminated Control<br>0b: Rx Termination disabled<br>1b: Rx Termination enabled<br>Default is same as 'Terminated Link' bit in PHY capability register |
| 4 | RW | Tx Eq Enable:<br>0b: Eq Disabled<br>1b: Eq Enabled<br>Default is 0 |
| 5 | RW | Clock Mode Select<br>0h: Strobe Mode<br>1h: Free running mode<br>Default is 0 |

TABLE 8-continued

Example PHY Control Register

| Bit | Attribute | Description |
|---|---|---|
| 6 | RW | Clock phase support select:<br>0h: Differential clock<br>1h: Quadrature clock |
| 31:7 | Rsvd | Reserved |

Table 9 shows another example of a PHY status register. Status registers may be accessed and read by the D2D adapter to understand characteristics of the link following training of the link by the PHY block and adjust the capabilities it advertises to the link partner's D2D adapter based on these link training results. In some implementations, the PHY layer status register may be global for the PHY:

TABLE 9

Example PHY Status register

| Bit | Attribute | Description |
|---|---|---|
| 2:0 | RO | Module to Byte mapping<br>00h: no Module reversal (LSB Module to LSB Module)<br>01h: MSB Module to LSB module connectivity<br>Others: Reserved<br>Module to Byte mapping hardware writes it post hardware training<br>Default is 0h |
| 3 | RO | Rx Terminated Status<br>0b: Rx Termination disabled<br>1b: Rx Termination enabled<br>Default is same as 'Terminated Link' bit in PHY capability register |
| 4 | RO | Tx Eq Status:<br>0b: Eq Disabled<br>1b: Eq Enabled<br>Default is 0 |
| 5 | RO | Clock Mode Status:<br>0h: Strobe Mode<br>1h: Free running mode<br>Default is 0 |
| 6 | RO | Clock phase Status:<br>0h: Differential clock<br>1h: Quadrature clock |
| 7 | RO | Lane Reversal within Module: Indicates if Lanes within a module are reversed<br>0b: Lanes within module not reversed<br>1b: Lanes within module are reversed |
| 31:7 | Rsvd | Reserved |

Registers utilized by software for the D2D adapter and/or PHY layer blocks may be include registers hosted in local memory of the respective block as well as MMIO-mapped register blocks are defined in the first version of the specification. UCIe-aware firmware and software in a system may discover the presence and capabilities of UCIe links using these registers. Table 10 outlines how such discovery may take place in one example implementation:

TABLE 10

Example Software Access Scheme

| UCIe Links | How discovered? | Description |
|---|---|---|
| In host | Host specific Register Block (CiRB) containing UCIe Link DVSEC Capability | CiRB is at a host defined static location. Each UCIe Link has a separate CiRB Base address and these are enumerated to OS via UCIe Early discovery table (CIDT)1<br>Association of a UCIe Link to 1 or more |

TABLE 10-continued

Example Software Access Scheme

| UCIe Links | How discovered? | Description |
| --- | --- | --- |
| | | Root ports is described in CIDT, allowing for UCIe-aware SW to understand the potential shared nature of the UCIe Link. |
| In End Points | Dev0/Fn0 of the device carries a UCIe Link DVSEC Capability. | In multi-stack implementations, Dev0/Fn0 of the endpoint in only one of the stacks carries the UCIe Link DVSEC Capability |
| In Switch USP | Dev0/Fn0 of the USP carrying a UCIe Link DVSEC Capability | In multi-stack implementations, Dev0/Fn0 of the USP in only one of the stacks carries the UCIe Link DVSEC Capability. |
| In Switch DSP | Dev0/Fn0 of the Switch USP carrying one ore more CiSRB DVSEC Capability | UCIe Links below the switch are described in CiSRB whose base address is provided in the CiSRB DVSEC Capability<br>A UCIe Link DVSEC capability per downstream UCIe Link is present in the CiSRB<br>Association of a UCIe Link to 1 or more Switch DSPs is described as part of the UCIe Link DVSEC Capability, allowing for UCIe-aware SW to understand the potential shared nature of the UCIe interface Note: Its legal for a Switch USP to carry the CiSRB DVSEC capability but not a UCIe Link DVSEC Capability |

A region of memory (e.g., a CiRB region) may be defined at a static location on the device to store the respective registers for the device. Configuration space registers may be accessed using configuration reads and configuration writes. Register blocks in memory mapped regions may be accessed using standard memory reads and memory writes. In some implementations, retimer registers are not directly accessible from host software and are accessed via a window mechanism over the sideband interface. For debug and run-time link health monitoring, host software can also access the UCIe related registers in any partner die using the sideband interface (e.g., using the same window mechanism), among other example implementations.

Figure 15A:
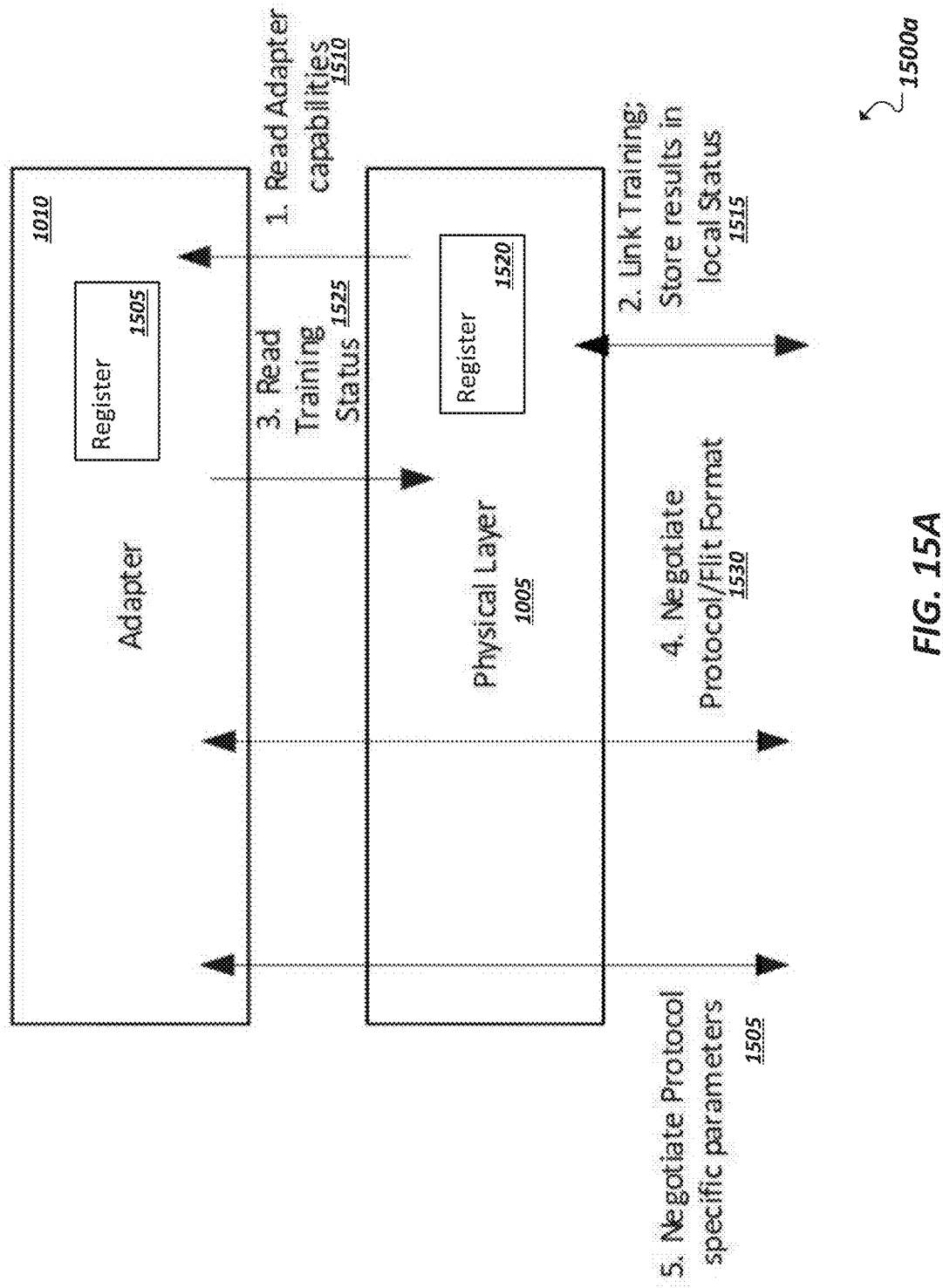
FIGS. 15A-15C are diagrams illustrating example flows for initialization of a UCIe-based link.

Parameter exchange and negotiation in UCIe may modularize capabilities between the D2D adapter and PHY block, as discussed below. For instance, FIG. 15A shows a simplified block diagram illustrating an example parameter exchange and negotiation utilizing a UCIe D2D adapter block 1010 and PHY block 1005 (including one or more multiple PHY modules). A layered negotiation flow may be used that allows the PHY layer block(s) 1005 and D2D adapter circuitry block 1010 to even be developed by different IP vendors but still interoperate from a UCIe point of view. In one example implementation, the PHY layer 1005 is to perform link training for the link. Software may initiate link bring up and link training (e.g., by writing a value to a register (e.g., the link control register) of the D2D adapter, which may then send a signal over RDI to the PHY layer to trigger link training operations. The PHY layer 1005 may read 1510 the registers (e.g., 1505) of the D2D adapter 1010 to determine capabilities of the D2D adapter to determine capabilities that the PHY block 1005 might advertise during link training 1515, such as the maximum speed to advertise, etc. As one example, a PHY block may be connected to a D2D adapter that does not support retry flows. As a result, the PHY block may decide to only advertise speeds where the BER is low enough for the link to reliably function without retry, among other example factors and implementations. During link training, the PHY may train the link on a per-module basis, utilizing respective sideband lanes of the module to communicate with the remote link partner and negotiate parameters of the link. Link training 1515, in one example implementation, may include a transmitter (TX) data to clock point test, TX data to clock eye width sweeping, receiver (RX) data to clock point training, and RX data to clock eye width sweeping. Parameters and messages to coordinate link training may be sent over the sideband lanes, with test patterns sent on the data lanes during the various link training steps.

Continuing with the example of FIG. 15A, with link training 1515 completed, the D2D adapter 1010 reads 1525 a register (e.g., 1520) of the PHY layer block 1005 to identify the results of the link training 1515 before advertising capabilities to the link partner D2D adapter, adjusting any capabilities affected by the results of the link training to make them consistent with the PHY layer 1005. For example, if spare lanes are determined as not available during link training, the D2D adapter may not advertise support for optimized modes that may require the use of such spare lanes, among other examples.

Protocol and flit format negotiations 1530 and protocol specific parameters 1535 may be performed following link training, with the D2D adapter communicating with the link partner's D2D adapter over the trained sideband channel of the link. In UCIe, parameter exchange and protocol negotiation may not only be modulized between the D2D adapter and PHY layer, but may also be conducted in a multi-phase manner. This allows the architecture to decouple link/flit optimizations from protocol features. In other protocols today, such as CXL, link and flit format negotiations and optimized are intermingled within one negotiation, which does not allow easy scaling, among other example issues. In UCIe, support of a protocol may first be determined, such as by identifying the presence or absence of a DVSEC associated with a particular underlying protocol, where the presence of such a register implies the support for that protocol. For example in the case of CXL, the presence or absence of a Flexbus Port DVSEC determines whether CXL is a supported capability in the D2D adapter. Once the protocol and link/flit capabilities are negotiated with remote link partner, a second phase of negotiation is performed to determine the details of protocol support (for example in the case of CXL, this second phase determines whether CXL.io or CXL.cache or CXL.mem or a combination of those are supported), among other examples.

As one illustrative example, after training of the link by the PHY layer block, the link parameters configured during training may be documented in the PHY status register (e.g., defined in the UCIe Physical Layer DVSEC capability). The D2D adapter may read the PHY status register to identify, for example, whether the link can support one or more optimized modes supported by the D2D adapter. For instance, the D2D adapter may read the PHY status register to determine whether spare lanes are available after the lane repair flow (e.g., by reading the corresponding register bit names are "Three_Spare_Lanes_Ready" and "Two_Spare_Lanes_Ready") to determine if the requisite spare lanes are available to allow the optimized mode(s) to be advertised by the D2D adapter to the link partner D2D adapter. If sufficient spare lanes are not available, the D2D adapter does not advertise support for the corresponding optimized mode to the remote link partner. In one example, if an optimized mode flit format requires N spare lanes, the D2D adapter ensure that at least N+1 spare lanes by reading results of the link training before advertising support for that format. Any extra lanes (above the N lanes to be used for the optimized modes) is to be provisioned for in-field repair and increase the probability that the optimized mode will not fail over the life cycle of the part. As another example, the PHY status register may be read (e.g., from register bit "Adapter_Retry_Needed") to inform the D2D adapter if the link training has determined that the BER threshold necessitates retry support for normal link operation. If this bit is set and the D2D adapter is capable of supporting retry, the D2D adapter advertises this capability to the remote link partner during parameter exchanges (e.g., using sideband messaging over the trained link). In one example implementations, if adapter retry is necessitated, some optimized modes may be disabled (e.g., two lane optimized mode), among other example implementations.

Figure 15B:
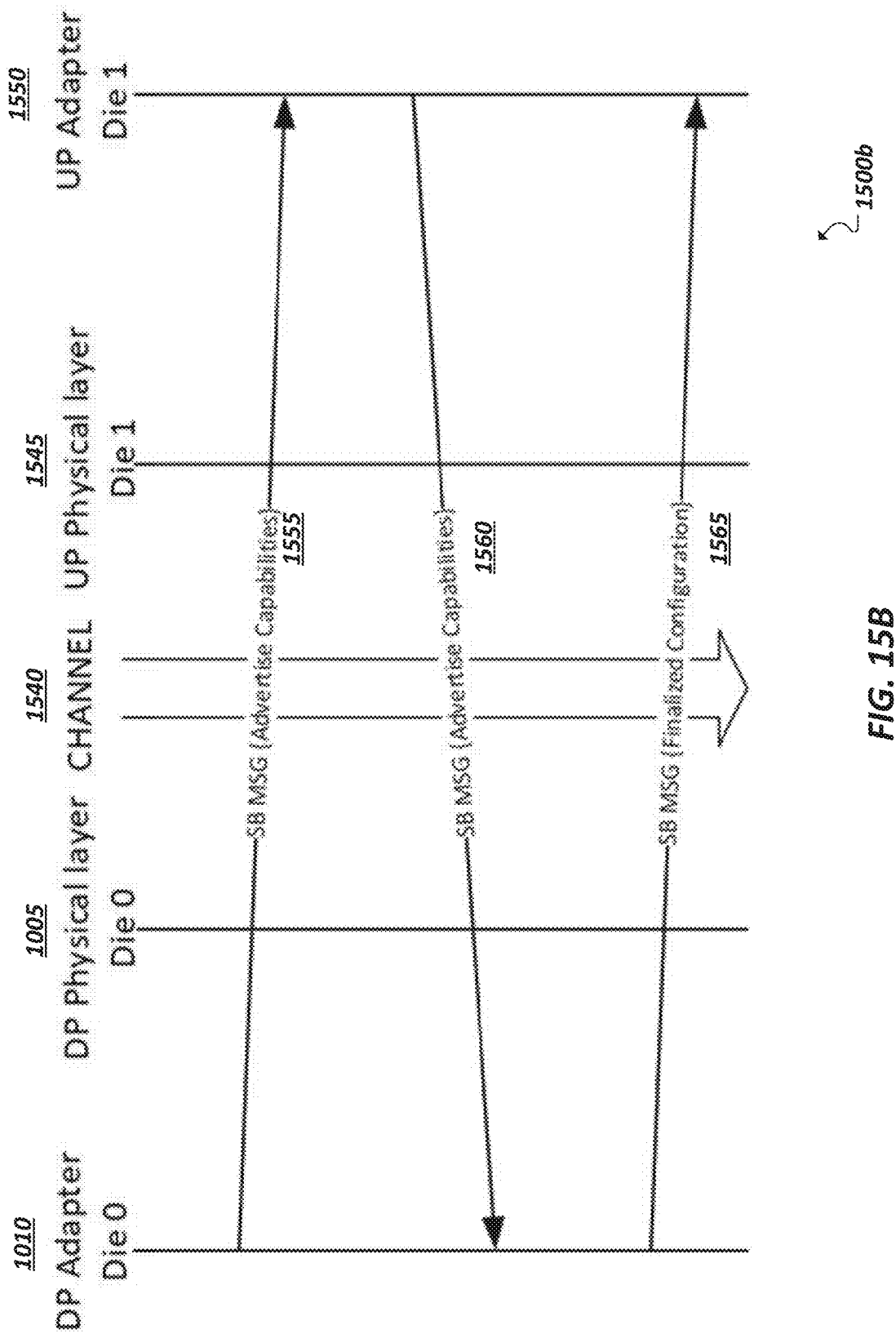

Turning to FIG. 15B, a diagram 1500*b* is shown illustrating the general parameter exchange flow. When the UCIe link (channel) has been brought up and trained, a first D2D adapter 1010 communicates messages (e.g., a {AdvCap.Adapter} sideband message) via its corresponding PHY 1005 over a sideband channel 1540 of the link to be received at a receiver of the link partner PHY 1545 and passed to the D2D adapter 1550 of the link partner to advertise the capabilities 1555 of the first end point (based on both the capabilities of the D2D adapter 1010 and the results of the link training). Likewise, the link partner D2D adapter 1550 advertises 1560 its capabilities via return sideband messaging over the sideband channel 1540 of the link. In some implementations, the link partner D2D adapter 1550 adapts the capabilities it advertises based on the contents of the capabilities message 1555 it receives, omitting capabilities that are not advertised as supported by the other D2D adapter 1010. By way of example, if PCIe or CXL protocol support is going to be advertised, the link partner D2D adapter 1550 (e.g., of the upstream port on the link partner device) waits for the first message 1555 from the other D2D adapter 1010 (e.g., of the downstream port of the device), reviews the capabilities advertised in the message 1555 and then sends its own sideband message 1560 of advertised capabilities to advertise whether it also supports PCIe or CXL. Once D2D adapter 1010 receives the return capability advertisement message 1560, it determines which capabilities are jointly supported by both D2D adapters and responds with a finalized configuration sideband message 1565 (e.g., {FinCap.Adapter} sideband message) to finalize the parameter exchange and allow each D2D adapter to finalize configuration and communicate this information to the protocol layer block to establish the flit format to be used on the link.

Figure 15C:
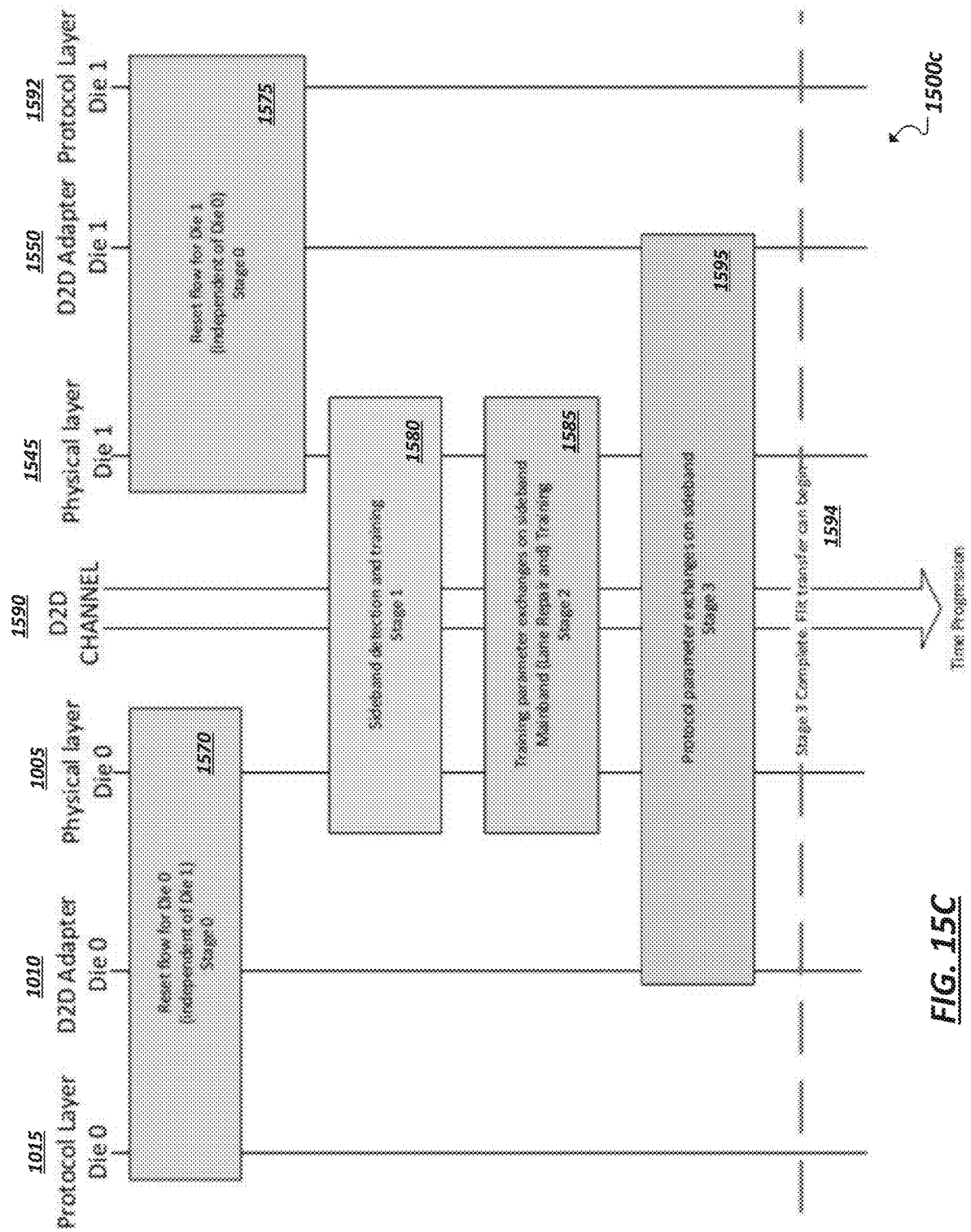

Turning to FIG. 15C, another diagram 1500*c* is shown summarizing the high-level stages of an example link initialization of a die-to-die link 1590 that is to couple two link partner dies each with its respective PHY block (e.g., 1005, 1545), D2D adapter (e.g., 1010, 1550), and protocol layer blocks (e.g., 1015, 1592). Four stages may be completed before protocol flit transfer can begin on the mainband channel of the link. In this example, a first stage, Stage 0, resets the die and its ports in preparation for link initialization. Die reset flows 1570, 1575 are die-specific and happens independently for each die. FIG. 15C illustrates flows 1570, 1575 in different sizes to denote that different dies can take different amounts of time to finish their respective implementations of Stage 0. Stage 1 (1580) involves sideband detection and training. Stage 2 (1585) involves main-band training and repair. Stage 3 (1595) involves parameter exchanges between the D2D adapters (e.g., 1010, 1550) to negotiate the protocol and flit formats to be used on the link.

Stage 3 (1595) may be considered a D2D initialization. When stages 1 and 2 are complete, the RDI state machine moves to an Active state. Once parameter exchanges have been successfully completed, the D2D adapter reflects the result to the protocol layer block(s) to which it is connected on FDI, and moves on to carry out the FDI bring up flow. Once FDI is in Active state, it concludes Stage 3 of link initialization and protocol flit transfer can begin. In cases where there are two protocol stacks negotiated for operation over the same UCIe Link, the FDI bring up flow is performed independently for each protocol stack. In some implementations, the data width on FDI is a function of the frequency of operation of the UCIe stack as well as the total bandwidth being transferred across the UCIe physical Link (which in turn depends on the number of lanes and the speed at which the lanes are operating). The data width on RDI is fixed to at least one byte per physical lane per module that is controlled by the D2D adapter. For instance, flit formats in an example configuration of RDI may be mapped to a 64 lane module (e.g., of an advanced package configuration) on the PHY of UCIe.

As introduced above, each D2D adapter (e.g., 1010, 1550) determines the results of the PHY layer training (e.g., from 1580, 1585) to determine what, if any limitations, exist that prevent the D2D adapter from utilizing (and advertising) all of its capabilities, as well as characteristics of the link that might require the D2D adapter to implement its various link reliability features (e.g., retry, CRC, FEC, etc.). For instance, from the PHY training results, the D2D adapter may determine whether and/or when retry or utilize other reliability features for given link speeds and configurations determined during link training by the PHY. In cases where the D2D adapter is capable of supporting retry, it advertises this capability to the remote link partner during parameter exchanges. For UCIe Retimers, the D2D adapter may also determine the flow control mechanism that is to be used, such as the credits to be advertised for the retimer receiver buffer (e.g., where each credit corresponds to 256B of mainband data storage).

A variety of capabilities are negotiated between link partners during parameter exchange. The capabilities (if enabled) are communicated to the remote link partner using a sideband message. For instance, a capability is "advertised" by the D2D adapter setting a bit value to 1b in a field corresponding to one of the potential capabilities defined in the capability advertisement (e.g., {AdvCap.Adapter}) sideband message. Capabilities may include the following examples:

TABLE 11

Example Capabilities within a Parameter Exchange

| Capability | Description |
| --- | --- |
| Raw Mode | This parameter is advertised if the corresponding bit in the UCIe Link Control register is 1b. Software/Firmware enables this based on system usage scenario. If the PCIe or CXL protocols are not supported, and Streaming Protocol is to be negotiated without any vendor-specific extensions, "Raw_Mode" must be 1b and advertised. |
| 68B Flit Mode | This is a protocol parameter. This is advertised if the D2D adapter and Protocol Layer support CXL 68B Flit Mode or PCIe Non-Flit Mode. If PCIe Non-Flit Mode is the final negotiated protocol, it will use the CXL.io 68B Flit Mode formats as defined in the CXL 2.0 Specification. |
| CXL 256B Flit Mode | This is a protocol parameter. This is advertised if the D2D adapter and Protocol Layer support the CXL protocol and CXL 256B Flit Mode. |
| PCIe Flit Mode | This is a protocol parameter. This is advertised if the D2D adapter and Protocol Layer support the PCIe protocol and PCIe Flit Mode. |
| Streaming | This is a protocol parameter. This is advertised if the D2D adapter and Protocol Layer support Streaming protocol in Raw Mode and this capability is enabled. |
| Optimized Mode Three Lanes | This is only be advertised if "Three Spare Lanes Ready" is set and the D2D adapter supports Optimized Mode data path formats along with CRC generation and Retry. |
| Optimized Mode Two Lanes | This is only be advertised if "Two Spare Lanes Ready" is set and the Adapter supports Optimized Mode data path formats. |
| Retry | This is advertised if the Adapter supports Retry and "Adapter Retry Needed" is set (e.g., in the PHY link status register). As an exception, the link in not operational if "Adapter Retry Needed" is set, but "Retry Capable" is not advertised or negotiated. The only exception is if the Adapter is going to run in "Raw Mode". |
| Multiple Protocol Enable | This is advertised if the D2D adapter is connected to multiple FDI instances corresponding to two or more sets of Protocol Layers. It is only advertised if the Adapter (or SoC firmware in Stage 0 of Link Initialization) has determined that the UCIe Link is to be operated in this mode. Each Protocol Layer enable bit (e.g., "Stack0 Enable", "Stack1 Enable", etc.) are to be set to 1b if this bit is advertised. |
| Parity | This is advertised if enabled, and "Raw Mode" is advertised, and "Two Spare Lanes Ready" is set. |
| Stack0 Enable | This is advertised if Protocol Layer corresponding to Stack 0 exists and is enabled for operation with support for the advertised protocols. |
| Stack1 Enable | This is advertised if Protocol Layer corresponding to Stack 1 exists and is enabled for operation with support for the advertised protocols. |
| CXL Latency Optimized (Format 5) | This is advertised if the D2D adapter and Protocol Layer support a first CXL Latency Optimized flit format ("Format 5"). The Protocol Layer does not take advantage of the spare bytes in this Flit format. This is not advertised if CXL protocol and 256B Flit Mode of CXL are not supported or enabled. |
| CXL Latency Optimized (Format 6) | This is advertised if the D2D adapter and Protocol Layer support a first CXL Latency Optimized flit format ("Format 6"). The Protocol Layer is taking advantage of the spare bytes in this flit format. This is not advertised if CXL protocol and 256B Flit Mode of CXL are not supported or enabled. |
| Retimer | This is advertised if the Adapter of a UCIe Retimer is performing Parameter Exchanges with the UCIe Die within its package. |
| Retimer Credit | This is a 9-bit value advertising the total credits available for Retimer's Receiver Buffer. Each credit corresponds to 256B data. |
| Downstream Port | This is set by Downstream Ports to inform the remote Link partner that it is a Downstream Port. It is useful for Retimers to identify if they are connected to a Downstream Port UCIe die. This bit is set to 0b if "Retimer" is set to 1b. |
| Upstream Port | This is set by Upstream Ports to inform the remote Link partner that it is an Upstream Port. It is useful for Retimers to identify if they are connected to an Upstream Port UCIe die. This bit is set to 0b if "Retimer" is set to 1b. |

Finalizing configuration based on parameter exchange may form the basis of an agreement by the D2D adapters on the flit format that is to be used on the mainband of the link. Parameter exchange may be utilized to negotiate and determine the protocol that is to be used as well as the particular flit format to be used (e.g., where the protocol (e.g., CXL) defines multiple different flit formats under the protocol). Once the flit format and protocol parameters and negotiated and configuration finalized for the link 1590, the flit transfer 1594 can begin. For instance, in one example implementation, if CXL is advertised by both link partners, CXL is the final negotiated protocol. Accordingly, the CXL bit is set to 1b in the finalized configuration message and the PCIe, Streaming, and any other protocol bits are set to 0b in the finalized configuration message. In another implementation, support for specific modes of the CXL protocol (e.g., 256B or 68B) may be explicitly advertised in the first round of parameter exchange messages. As an example, if "68B Flit Mode" is advertised by both link partners, it may be set to 1b in the finalized configuration message, while if "CXL 256B Flit Mode" is advertised by both link partners, it is set to 1b in the finalized configuration message. When CXL (or CXL 256B or 68B) is negotiated, an additional handshake, or sideband message exchange may be performed (e.g., using the "Advertised Capability for CXL" and the "Finalized Capability for CXL" messages) to determine the details of which of the multiple CXL flit modes is negotiated. This additional handshake may follow the same flow pattern as in the example of FIG. 15B.

Continuing with this example, if CXL is not advertised by any one of the link partners, but PCIe is advertised by both, it is the final protocol. In such instances, the "PCIe" bit is set to 1b and other protocol bits (e.g., "CXL" and "Streaming") are set to 0b in the Finalized Configuration message. If CXL and PCIe have not been negotiated, but "Streaming" is advertised by both Link partners, it is the final protocol, with "Streaming" set to 1b, and "CXL" and "PCIe" set to 0b in the Finalized Configuration message. In one example, if no common protocol could be negotiated, the D2D adapter may transition RDI to a Link Error state and take the necessary steps for error escalation.

As other examples of finalizing parameters, if "Raw_Mode" is advertised by both link partners, "Raw_Mode" is set to 1b in the finalized configuration message (e.g., {FinCap.Adapter}). If both Link partners advertised "Retry", Adapter Retry is enabled and "Retry" is set to 1b in the finalized configuration message. If both link partners advertised "Multi_Protcol_Enable", both Stack0 and Stack1 are enabled by the adapter, and all three parameters ("Multi_Protcol_Enable", "Stack0_Enable" and "Stack1_Enable") are set to 1b in the finalized configuration message. If "Multi_Protocol_Enable" is not negotiated, then the lowest common denominator is used to determine if Stack0 or Stack1 is enabled, and the corresponding bit is set to 1b in the finalized configuration message. If both Stack enables are advertised, then Stack0 is selected for operational mode and only Stack0 Enable is set to 1b in the finalized configuration message. For latency optimized formats, if CXL_LatOpt_Fmt5 or CXL_LatOpt_Fmt6 is advertised by both, then the corresponding bit is set to 1b in the finalized configuration message, and so on.

If PCIe or CXL protocols are not advertised, and Streaming protocol is to be negotiated, there may be no notion of downstream port or upstream port and each side may independently advertise its respective capabilities. In some implementations, additional vendor-defined sideband messages may be defined and exchanged to negotiate corresponding vendor-specific extensions, such as for use in configuring the specifics of the Streaming Protocol. The finalized configuration may be implicitly determined to be the Raw Mode if no vendor specific extensions are negotiated. In such examples, finalized configuration messages may not be sent for Streaming Protocol, with the D2D adapters determining vendor specific requirements a priori (e.g., at design integration or during Stage 0 of Link bring up), among other examples.

Figure 16:
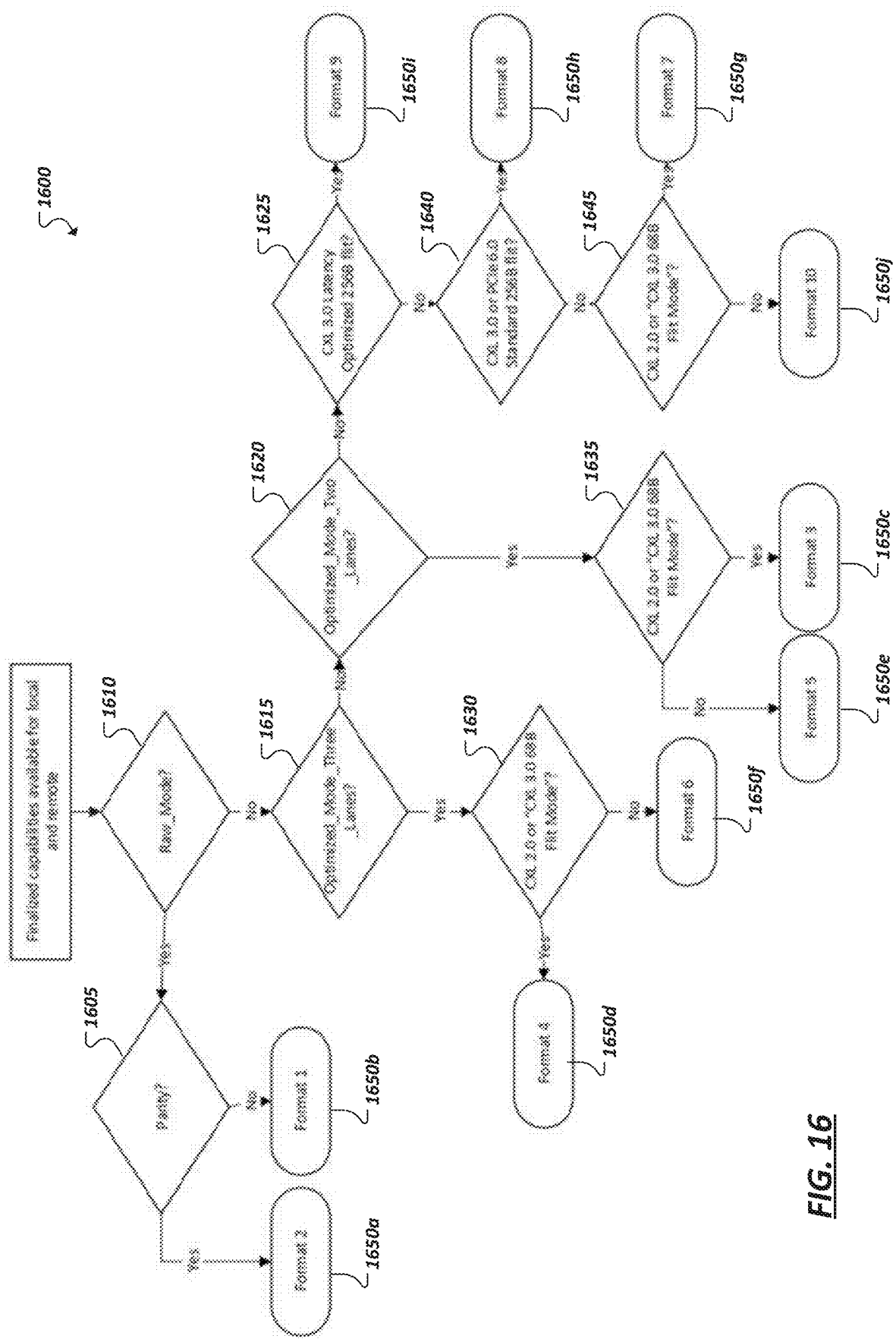
FIG. 16 is a diagram illustrating an example decision tree for selecting a particular flit format for use with a UCIe-based link.

The specific flit format chosen is based on the capabilities negotiated (e.g., after they have been reflected in the link status registers following finalization of the configuration. As an example, FIG. 16 is a decision tree diagram 1600 illustrating one example algorithm used by the link partner D2D adapters to interpret the finalized parameter configuration to jointly determine a flit format to be used that corresponds to this configuration. For instance, the decision tree may factor in finalized configurations such as whether parity is supported (at 1605), whether raw mode is supported (at 1610), whether an optimized mode (at 1615, 1620, 1625) is supported, whether streaming is supported, and whether CXL 256B, CXL 68B, or PCIe flit mode is supported (at 1630, 1635, 1640, 1645), to ultimately determine which of multiple (e.g., ten) possible flit formats (e.g., 1650*a-j*) is to be used in the mainband communications. The determined flit mode is communicated by the D2D adapter to the protocol layer block, which the protocol layer uses to generate data in accordance with the agreed upon flit format.

Tables 12 and 13 show another example scheme for determining the appropriate flit format to use based on the finalized configurations negotiated by the D2D adapters of the link partners. For instance, Table 12 shows a truth table for determining the protocol to utilize based on values in the finalized configuration message(s). For instance, a first finalized configuration message FinCap.Adapter may be utilized in a first handshake, with a second finalized configuration message FinCap.CXL being used if multiple CXL sub-protocols or flit formats are defined and CXL is advertised as supported by both link partners. Table 12 shows the various combination of values (1b indicating enabled) in the finalized configuration message, and the resulting protocol that will be determined by the D2D adapters from the corresponding combinations of finalized configuration message values:

TABLE 12

Example truth table for determination of protocol from finalized parameters

| {FinCap.Adapter} bits | | | | {FinCap.CXL} bits | | |
|---|---|---|---|---|---|---|
| 68B Flit Mode | CXL 256B Flit Mode | PCIe Flit Mode | Stream-ing | PCIe | CXL.io | Protocol |
| 1 | 1 | 1 | x | 0 | 1 | CXL |
| 1 | 0 | 1 | x | 1 | 0 | PCIe |
| 1 | 0 | 0 | x | 0 | 1 | CXL |
| 1 | 0 | 0 | x | 1 | 0 | PCIe |
| N/A | N/A | N/A | N/A | N/A | N/A | Streaming |

Table 13 is a truth table for determining the particular flit format to be used based on the combination of parameters in the finalized configuration (as advertised in the finalized configuration messages (e.g., FinCon.Adapter and FinCon.CXL):

TABLE 13

Example truth table for determining flit format from finalized configuration

| | {FinCap.Adapter} bits | | | | | {FinCap. CXL} bit | |
|---|---|---|---|---|---|---|---|
| Raw_ Mode | CXL 68B Flit Mode | CXL 256B Flit Mode | PCIe Flit Mode | CXL_ Lat Opt_ Fmt5 | CXL_ Lat Opt_ Fmt6 | 68B Enhanced Flit | Flit Format |
| 1 | x | x | x | x | x | x | Format 1: Raw Mode |
| 0 | x | 1 | x | 0 | 0 | x | Format 4: Standard 256B Flit Mode for CXL |
| 0 | x | 1 | x | x | 1 | x | Format 6: Latency Optimized Mode for CXL |
| 0 | x | 1 | x | 1 | 0 | x | Format 5: Latency Optimized Mode for CXL |
| 0 | x | 0 | 1 | x | x | x | Format 3: Standard 256B Flit Mode for PCIe |
| 0 | 1 | 0 | 0 | x | x | 0 | Format 2: CXL 2.0 68B Flit Mode |
| 0 | 1 | 0 | 0 | x | x | 1 | Format 7: CXL 68B Enhanced Flit Mode |

In some implementations, once the protocol and flit format have been negotiated during initial link bring up, such as discussed above, they cannot be changed until the UCIe PHY transitions to Reset state, among other example implementations.

Figure 17A:
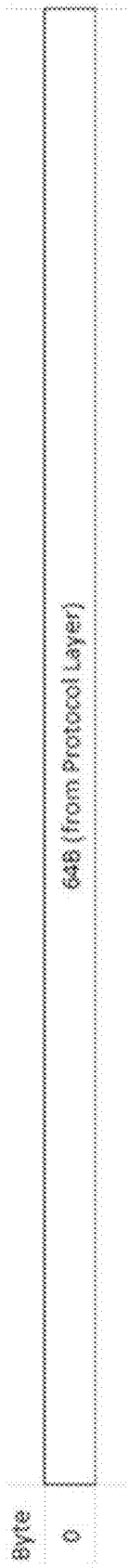
Figure 17B:
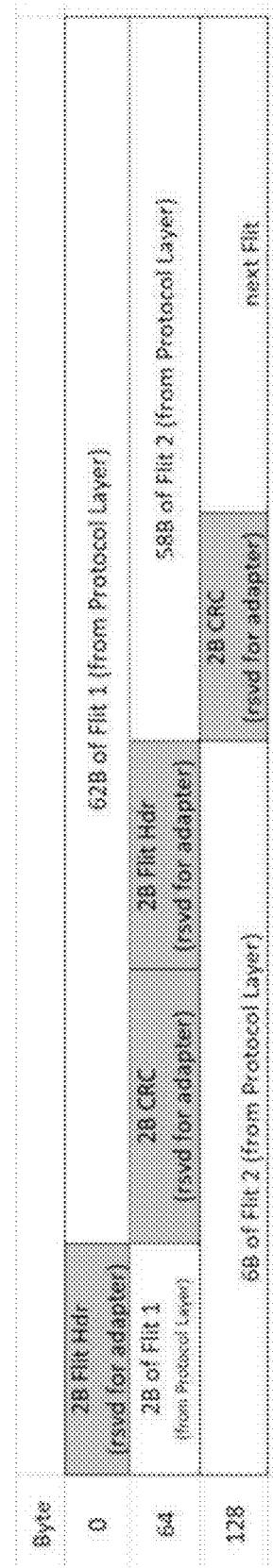
Figure 17C:
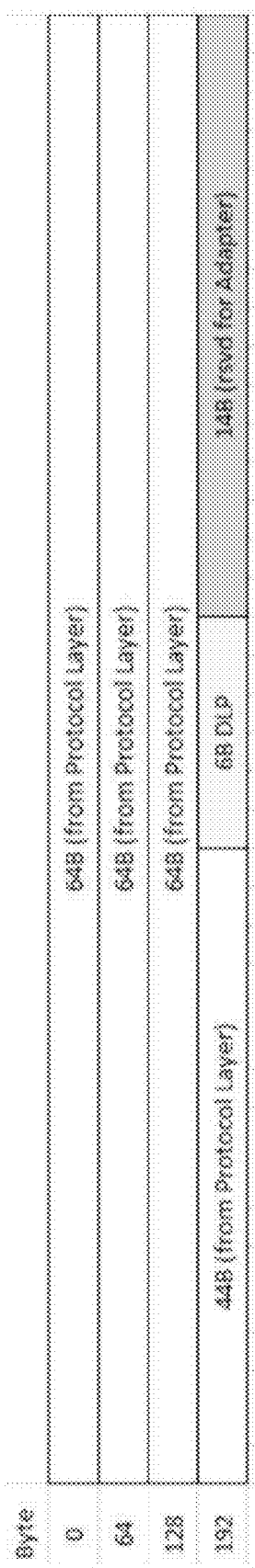
Figure 17D:
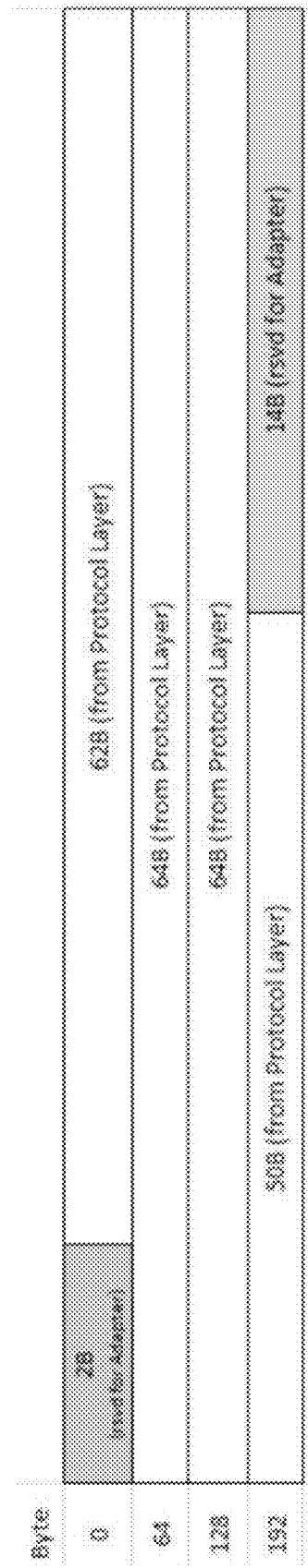
Figures 17E, 17F:
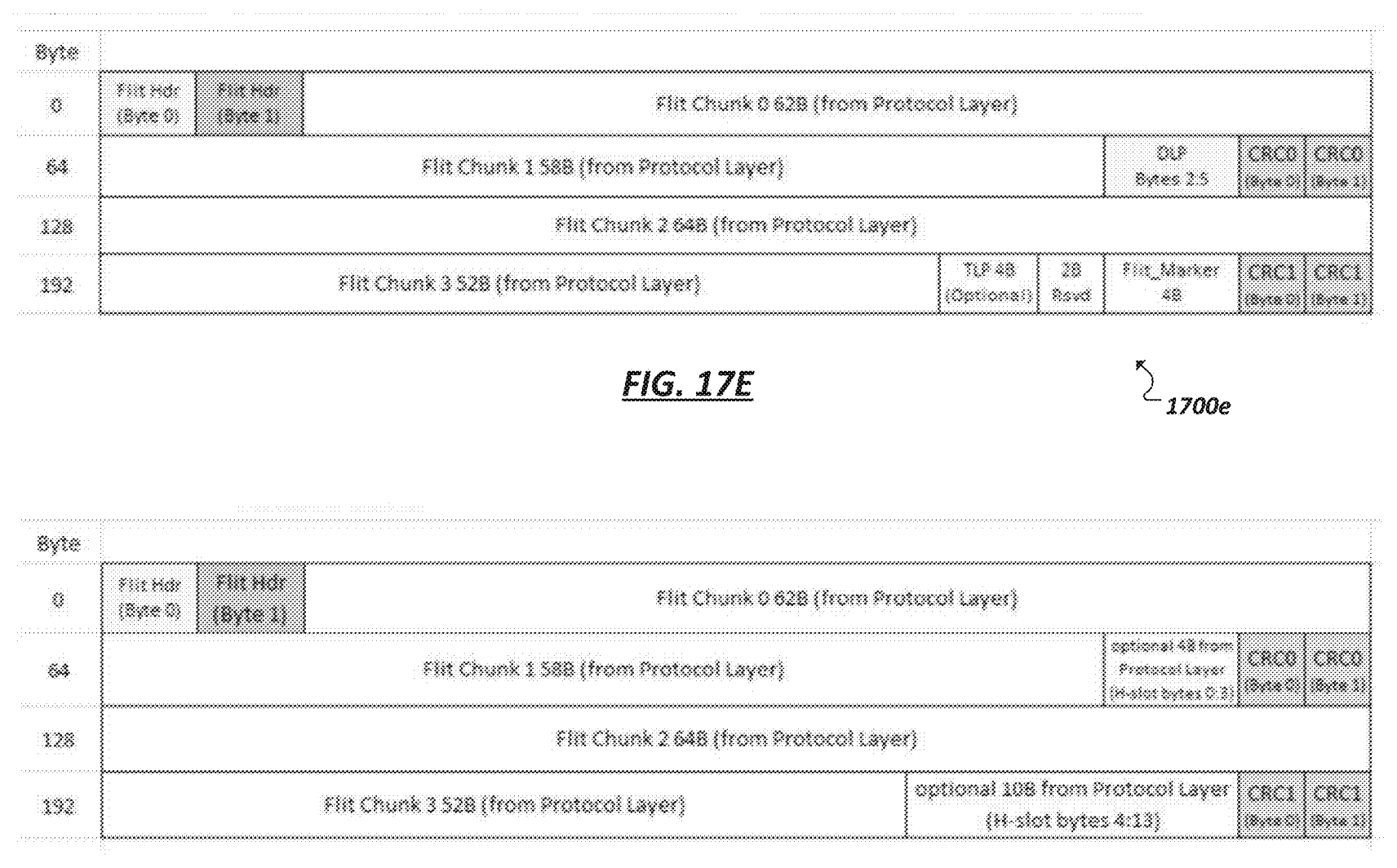

FIGS. 17A-17F illustrate example flit formats that may be selected for use by the D2D adapters of the link partners based on finalized configuration of parameters, such as discussed above. For instance, FIG. 17A shows an example format 1700*a* for raw mode (e.g., Format 1). FIG. 17B shows an example flit format 1700*b* for CXL 2.0 68B Flit Mode (e.g., Format 2). FIG. 17C shows an example flit format 1700*c* for Standard 256B Flit Mode for PCIe (e.g., Format 3). FIG. 17D shows an example flit format 1700*d* for Standard 256B Flit Mode for CXL (e.g., Format 4). FIG. 17E shows an example flit format 1700*e* for Latency Optimized Mode for CXL (e.g., Format 5). FIG. 17F shows an example flit format 1700*f* for another Latency Optimized Mode for CXL (e.g., Format 6), among other possible flit formats.

Figure 18A:
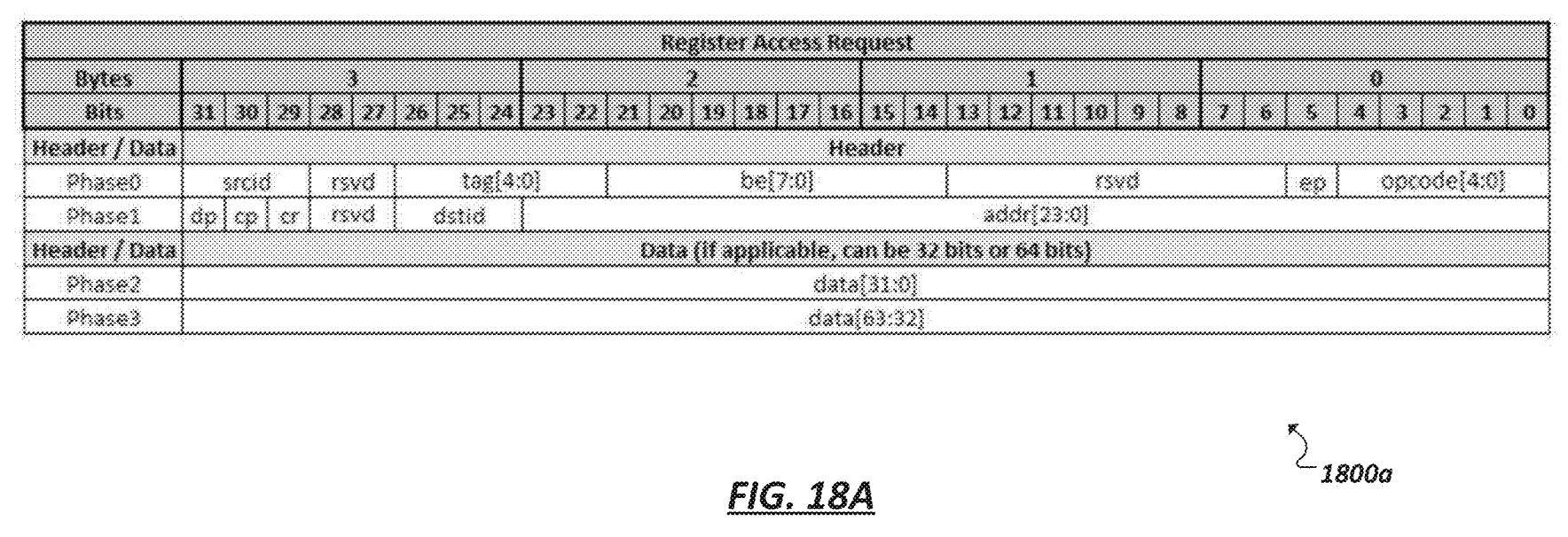
Figure 18D:
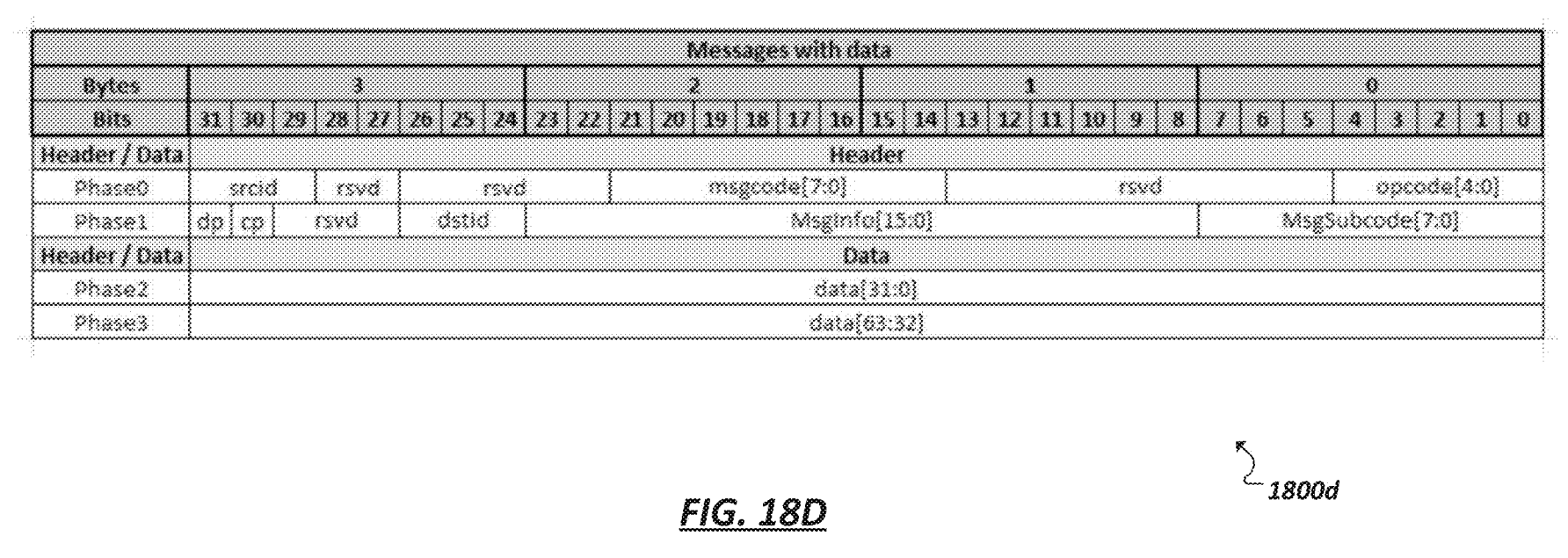

FIGS. 18A-18D illustrate example formats of register access packets, in accordance with one example implementations. For instance, FIG. 18A illustrates an example register access request packet format 1800*a*, in accordance with one example. FIG. 18B illustrates an example register access completion packet format 1800*b*. FIG. 18C illustrates an example format of messages without data payload, such as link management packets, no-operation (NOP) packets, or vendor-defined message packets, among other examples. FIG. 18D illustrates an example message with data payload packet format 1800*d*. Table 14 below summarizes some of the fields included in the example packets illustrated in FIGS. 18A-18D:

TABLE 14

Field description for register access requests

| Field | Description |
|---|---|
| CP | Control Parity (CP) is the even parity of all the header bits excluding DP. |
| DP | Data Parity is the even parity of all bits in the data payload. If there is no data payload, this bit is set to 0b. |
| Cr | If 1b, indicates one credit return for credited sideband messages. This field is only used by the Adapter for remote Link partner's credit returns for E2E credits. It is not used for local FDI or RDI credit loops. |
| Addr[26:0] | Address of the request. Different opcodes use this field differently. |
| BE[7:0] | Byte Enables for the Request. It is NOT required to be contiguous. BE[7:4] are reserved if the opcode is for a 32-bit request. |
| EP | Data Poison. If poison forwarding is enabled, the completer can poison the data on internal errors. |
| Tag[4:0] | Tag is a 5-bit field generated by the requester, and it must be unique for all outstanding requests that require a completion. The original requester uses the Tag to associate returning completions with the original request. |
| Data | Payload. Can be 32 bits or 64 bits wide depending on the Opcode. |

Table 15 shows example message encodings for inclusion in register access requests:

TABLE 15

Example message encodings

| Name | Msg code | Msg sub code | MsgInfo | Data Bit Encodings | Description |
|------|----------|--------------|---------|--------------------|-------------|
| {AdvCap. Adapter} | 01h | 00h | 0000h: Reserved FFFFh: Stall | [0]: "Raw_Mode" [1]: "68B Flit Mode" | Advertised Capabilities of the D2D Adapter |
| {FinCap. Adapter} | 02h | 00h | 0000h:Reserved FFFFh: Stall | [2]: "CXL 256B Flit Mode" [3]: "PCIe Flit Mode" [4]: "Streaming" [5]: "Retry" [6]: "Multi_Protocol_Enable" [7]: "Stack0_Enable" [8]: "Stack1_Enable" [9]: "CXL_LatOpt_Fmt5" [10]: "CXL_LatOpt_Fmt6" [11]: "Retimer" [20:12]: "Retimer Credits" [21]: "DP" [22]: "UP" [63:23]: Reserved | Finalized Capabilities of the D2D Adapter |
| {AdvCap. CXL} | 01h | 01h | 0000h: Reserved FFFFh: Stall | [23:0]: Flexbus Mode negotiation usage bits as defined for Symbols 12-14 of Modified TS1/TS2 Ordered Set in the CXL Specification, with the following additional rules: [0]: PCIe capable/enable - to be 1b for PCIe Non-Flit Mode. [1]: CXL.io capable/enable - 0b for PCIc Non-Flit Mode [2]: CXL.mcm capable/enable - 0b for PCIe Non-Flit Mode [3]: CXL.cache capable/enable - 0b for PCIe Non-Flit Mode [4]: CXL 2.0 capable - set for ports that support CXL protocols [8]: Multi-Logical Device - set to 0b for PCIe Non-Flit Mode. [9]: CXL 68B-Enhanced Flit Mode - set to 0b for PCIe Non-Flit Mode [12:10]: 0b. [14]: Retimer 2 [15]: CXL.io Throttle - 0b for PCIe Non-Flit Mode. [17:16]: NOP Hint Info-0b | Advertised Capabilities for CXL protocol. |
| {FinCap. CXL} | 02h | 01h | 0000h: Reserved FFFFh: Stall | | Finalized Capabilities for CXL protocol. |

Note that the apparatus', methods', and systems described above may be implemented in any electronic device or system as aforementioned. As specific illustrations, the figures below provide exemplary systems for utilizing the solutions as described herein. As the systems below are described in more detail, a number of different interconnects are disclosed, described, and revisited from the discussion above. While some of the examples above were based on CXL- or PCIe-based interconnects and devices, it should be appreciated that the solutions and features discussed above may be just as readily applied to other interconnect or protocol used to couple sockets, packages, boards, and the like within various computing platforms. As is readily apparent, the advances described above and UCIe-based protocols may be applied to any of the interconnects, fabrics, or architectures discussed herein, as well as other comparable interconnects, fabrics, or architectures not explicitly named or illustrated herein.

Figure 19:
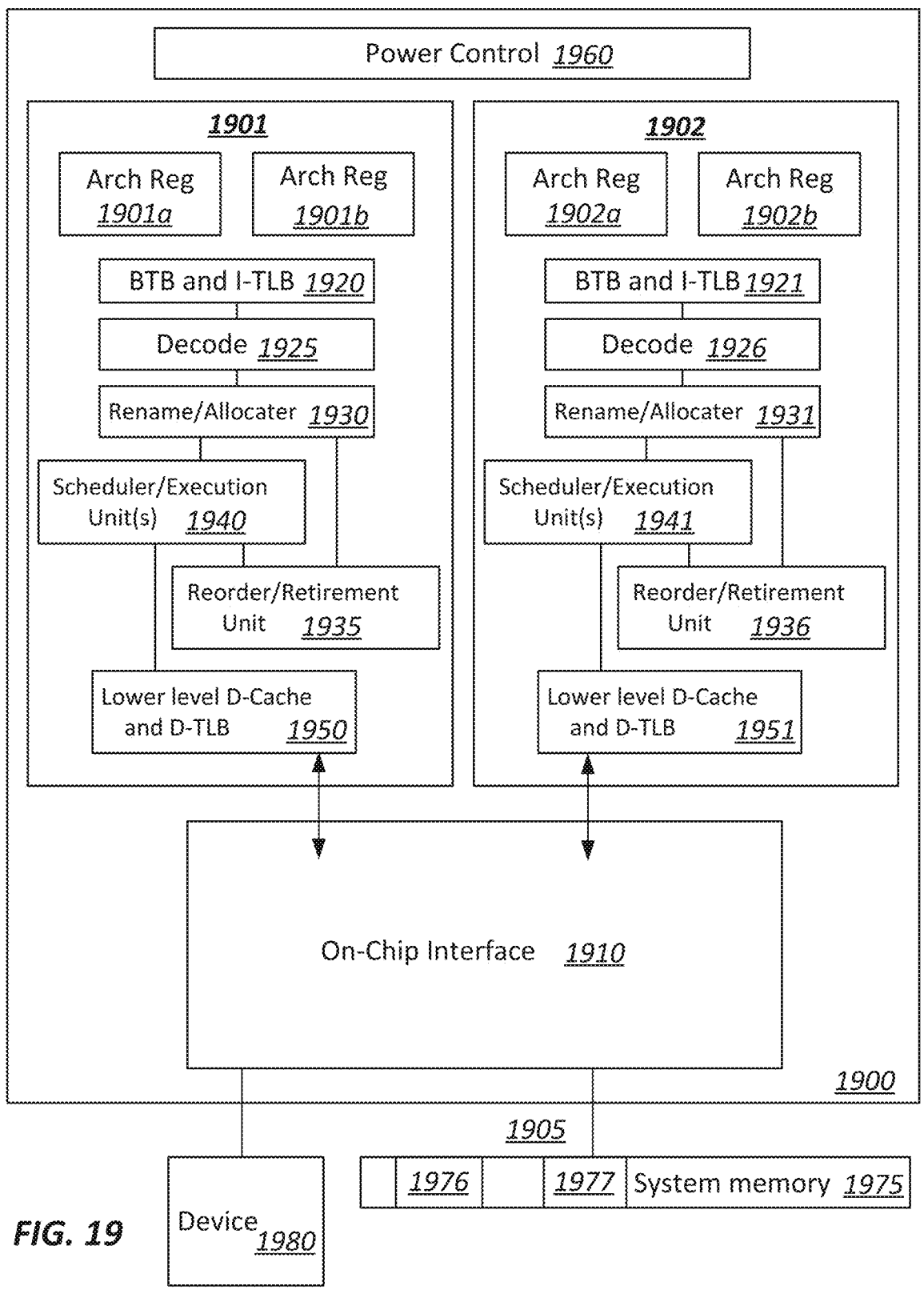
FIG. 19 illustrates an embodiment of a block diagram for a computing system including a multicore processor.

Referring to FIG. 19, an embodiment of a block diagram for a computing system including a multicore processor is depicted. Processor 1900 includes any processor or processing device, such as a microprocessor, an embedded processor, a digital signal processor (DSP), a network processor, a handheld processor, an application processor, a co-processor, a system on a chip (SOC), or other device to execute code. Processor 1900, in one embodiment, includes at least two cores—core 1901 and 1902, which may include asymmetric cores or symmetric cores (the illustrated embodiment). However, processor 1900 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 1900, as illustrated in FIG. 19, includes two cores—core 1901 and 1902. Here, core 1901 and 1902 are considered symmetric cores, i.e. cores with the same configurations, functional units, and/or logic. In another embodiment, core 1901 includes an out-of-order processor core, while core 1902 includes an in-order processor core. However, cores 1901 and 1902 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 1901 are described in further detail below, as the units in core 1902 operate in a similar manner in the depicted embodiment.

As depicted, core 1901 includes two hardware threads 1901a and 1901b, which may also be referred to as hardware thread slots 1901a and 1901b. Therefore, software entities, such as an operating system, in one embodiment potentially view processor 1900 as four separate processors, i.e., four logical processors or processing elements capable of executing four software threads concurrently. As alluded to above, a first thread is associated with architecture state registers 1901a, a second thread is associated with architecture state registers 1901b, a third thread may be associated with architecture state registers 1902a, and a fourth thread may be associated with architecture state registers 1902b. Here, each of the architecture state registers (1901a, 1901b, 1902a, and 1902b) may be referred to as processing elements, thread slots, or thread units, as described above. As illustrated, architecture state registers 1901a are replicated in architecture state registers 1901b, so individual architecture states/contexts are capable of being stored for logical processor 1901a and logical processor 1901b. In core 1901, other smaller resources, such as instruction pointers and renaming logic in allocator and renamer block 1930 may also be replicated for threads 1901a and 1901b. Some resources, such as re-order buffers in reorder/retirement unit 1935, ILTB 1920, load/store buffers, and queues may be shared through partitioning. Other resources, such as general purpose internal registers, page-table base register(s), low-level data-cache and data-TLB 1915, execution unit(s) 1940, and portions of out-of-order unit 1935 are potentially fully shared.

Processor 1900 often includes other resources, which may be fully shared, shared through partitioning, or dedicated by/to processing elements. In FIG. 19, an embodiment of a purely exemplary processor with illustrative logical units/resources of a processor is illustrated. Note that a processor may include, or omit, any of these functional units, as well as include any other known functional units, logic, or firmware not depicted. As illustrated, core 1901 includes a simplified, representative out-of-order (OOO) processor core. But an in-order processor may be utilized in different embodiments. The OOO core includes a branch target buffer 1920 to predict branches to be executed/taken and an instruction-translation buffer (I-TLB) 1920 to store address translation entries for instructions.

Core 1901 further includes decode module 1925 coupled to fetch unit 1920 to decode fetched elements. Fetch logic, in one embodiment, includes individual sequencers associated with thread slots 1901a, 1901b, respectively. Usually core 1901 is associated with a first ISA, which defines/specifies instructions executable on processor 1900. Often machine code instructions that are part of the first ISA include a portion of the instruction (referred to as an opcode), which references/specifies an instruction or operation to be performed. Decode logic 1925 includes circuitry that recognizes these instructions from their opcodes and passes the decoded instructions on in the pipeline for processing as defined by the first ISA. For example, as discussed in more detail below decoders 1925, in one embodiment, include logic designed or adapted to recognize specific instructions, such as transactional instruction. As a result of the recognition by decoders 1925, the architecture or core 1901 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 1926, in one embodiment, recognize the same ISA (or a subset thereof). Alternatively, in a heterogeneous core environment, decoders 1926 recognize a second ISA (either a subset of the first ISA or a distinct ISA).

In one example, allocator and renamer block 1930 includes an allocator to reserve resources, such as register files to store instruction processing results. However, threads 1901a and 1901b are potentially capable of out-of-order execution, where allocator and renamer block 1930 also reserves other resources, such as reorder buffers to track instruction results. Unit 1930 may also include a register renamer to rename program/instruction reference registers to other registers internal to processor 1900. Reorder/retirement unit 1935 includes components, such as the reorder buffers mentioned above, load buffers, and store buffers, to support out-of-order execution and later in-order retirement of instructions executed out-of-order.

Scheduler and execution unit(s) block 1940, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 1950 are coupled to execution unit(s) 1940. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 1901 and 1902 share access to higher-level or further-out cache, such as a second level cache associated with on-chip interface 1910. Note that higher-level or further-out refers to cache levels increasing or getting further way from the execution unit(s). In one embodiment, higher-level cache is a last-level data cache—last cache in the memory hierarchy on processor 1900—such as a second or third level data cache. However, higher level cache is not so limited, as it may be associated with or include an instruction cache. A trace cache—a type of instruction cache—instead may be coupled after decoder 1925 to store recently decoded traces. Here, an instruction potentially refers to a macro-instruction (i.e. a general instruction recognized by the decoders), which may decode into a number of micro-instructions (micro-operations).

In the depicted configuration, processor 1900 also includes on-chip interface module 1910. Historically, a memory controller, which is described in more detail below, has been included in a computing system external to processor 1900. In this scenario, on-chip interface 1910 is to communicate with devices external to processor 1900, such as system memory 1975, a chipset (often including a memory controller hub to connect to memory 1975 and an I/O controller hub to connect peripheral devices), a memory controller hub, a northbridge, or other integrated circuit. And in this scenario, bus 1905 may include any known interconnect, such as multi-drop bus, a point-to-point interconnect, a serial interconnect, a parallel bus, a coherent (e.g. cache coherent) bus, a layered protocol architecture, a differential bus, and a GTL bus. Bus 1905, as well as other links, interconnects, and fabrics interconnecting elements in the system of FIG. 19 may be implemented using UCIe, according to the principles discussed above. In some implementations, one or more of the elements shown in the system of FIG. 19 may be provided and interconnected on the same package. In some instances, some of the interconnected elements may be on different packages and coupled by off-package links, among other examples.

Memory 1975 may be dedicated to processor 1900 or shared with other devices in a system. Common examples of types of memory 1975 include DRAM, SRAM, non-volatile memory (NV memory), and other known storage devices. Note that device 1980 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 1900. For example in one embodiment, a memory controller hub is on the same package and/or die with processor 1900. Here, a portion of the core (an on-core portion) 1910 includes one or more controller(s) for interfacing with other devices such as memory 1975 or a graphics device 1980. The configuration including an interconnect and controllers for interfacing with such devices is often referred to as an on-core (or un-core configuration). As an example, on-chip interface 1910 includes a ring interconnect for on-chip communication and a high-speed serial point-to-point link 1905 for off-chip communication. Yet, in the SOC environment, even more devices, such as the network interface, co-processors, memory 1975, graphics processor 1980, and any other known computer devices/interface may be integrated on a single die or integrated circuit to provide small form factor with high functionality and low power consumption.

In one embodiment, processor 1900 is capable of executing a compiler, optimization, and/or translator code 1977 to compile, translate, and/or optimize application code 1976 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 20:
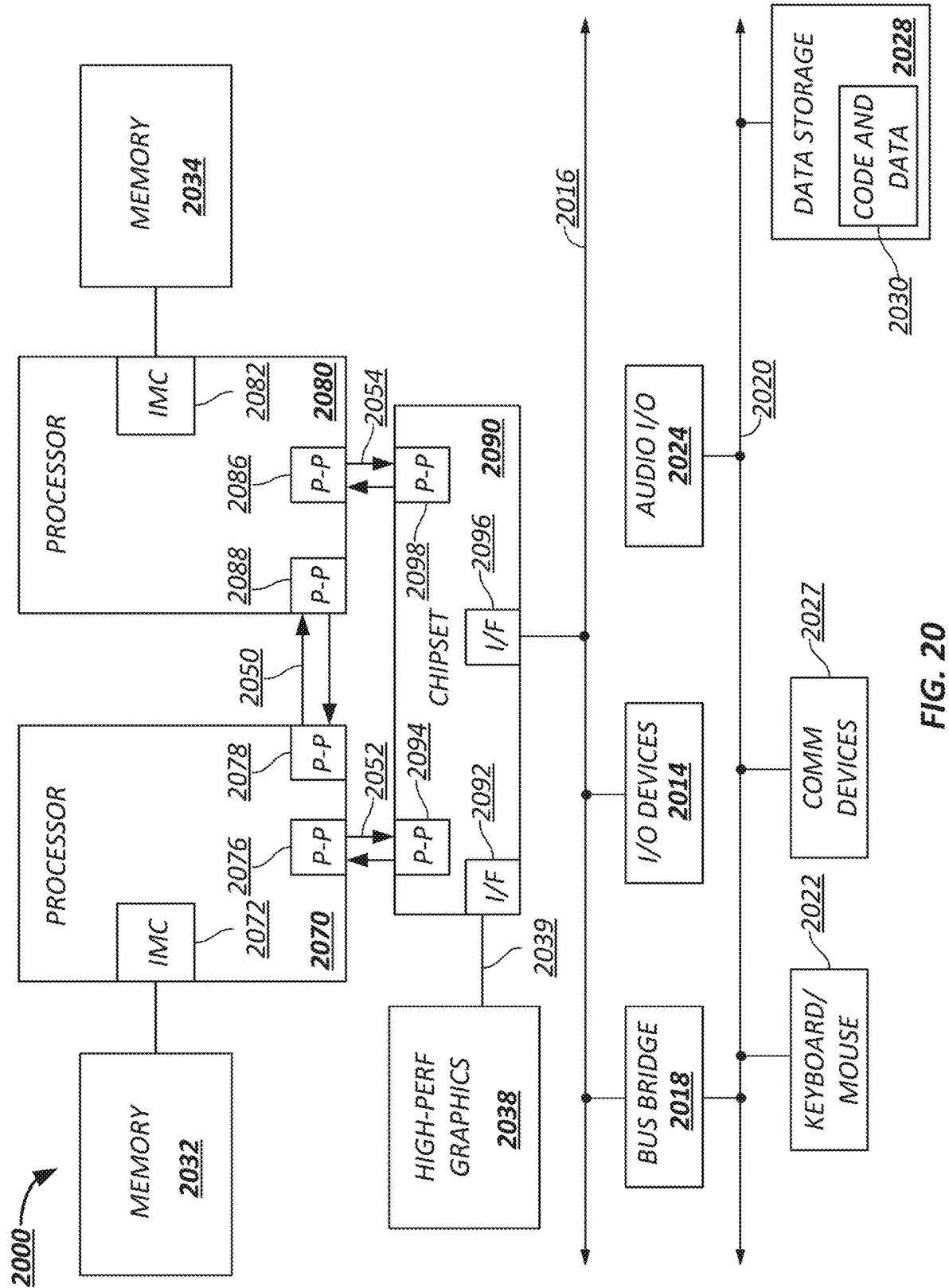
FIG. 20 illustrates an embodiment of a block for a computing system including multiple processors.

Referring now to FIG. 20, shown is a block diagram of a second system 2000 in accordance with an embodiment of the present disclosure. As shown in FIG. 20, multiprocessor system 2000 is a point-to-point interconnect system, and includes a first processor 2070 and a second processor 2080 coupled via a point-to-point interconnect 2050. Links, buses, interconnects, and fabrics interconnecting elements in the system may be implemented using UCIe, according to the principles discussed above. In some implementations, one or more of the elements shown in the system of FIG. 20 may be provided and interconnected on the same package. In some instances, some of the interconnected elements may be on different packages and coupled by off-package links, among other examples. Each of processors 2070 and 2080 may be some version of a processor. In one embodiment, 2052 and 2054 are part of a serial, point-to-point coherent interconnect fabric, such as a high-performance architecture. As a result, the solutions described herein may be implemented within a UPI or other architecture.

While shown with only two processors 2070, 2080, it is to be understood that the scope of the present disclosure is not so limited. In other embodiments, one or more additional processors may be present in a given processor.

Processors 2070 and 2080 are shown including integrated memory controller units 2072 and 2082, respectively. Processor 2070 also includes as part of its bus controller units point-to-point (P-P) interfaces 2076 and 2078; similarly, second processor 2080 includes P-P interfaces 2086 and 2088. Processors 2070, 2080 may exchange information via a point-to-point (P-P) interface 2050 using P-P interface circuits 2078, 2088. As shown in FIG. 20, IMCs 2072 and 2082 couple the processors to respective memories, namely a memory 2032 and a memory 2034, which may be portions of main memory locally attached to the respective processors.

Processors 2070, 2080 each exchange information with a chipset 2090 via individual P-P interfaces 2052, 2054 using point to point interface circuits 2076, 2094, 2086, 2098. Chipset 2090 also exchanges information with a high-performance graphics circuit 2038 via an interface circuit 2092 along a high-performance graphics interconnect 2039.

A shared cache (not shown) may be included in either processor or outside of both processors; yet connected with the processors via P-P interconnect, such that either or both processors' local cache information may be stored in the shared cache if a processor is placed into a low power mode.

Chipset 2090 may be coupled to a first bus 2016 via an interface 2096. In one embodiment, first bus 2016 may be a Peripheral Component Interconnect (PCI) bus, or a bus such as a PCI Express bus or another third generation I/O interconnect bus, although the scope of the present disclosure is not so limited.

As shown in FIG. 20, various I/O devices 2014 are coupled to first bus 2016, along with a bus bridge 2018 which couples first bus 2016 to a second bus 2020. In one embodiment, second bus 2020 includes a low pin count (LPC) bus. Various devices are coupled to second bus 2020 including, for example, a keyboard and/or mouse 2022, communication devices 2027 and a storage unit 2028 such as a disk drive or other mass storage device which often includes instructions/code and data 2030, in one embodiment. Further, an audio I/O 2024 is shown coupled to second bus 2020. Note that other architectures are possible, where the included components and interconnect architectures vary. For example, instead of the point-to-point architecture of FIG. 20, a system may implement a multi-drop bus or other such architecture.

While the solutions discussed herein have been described with respect to a limited number of embodiments, those skilled in the art will appreciate numerous modifications and variations therefrom. It is intended that the appended claims cover all such modifications and variations as fall within the true spirit and scope of this disclosure.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosures.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform example embodiments herein may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

The following examples pertain to embodiments in accordance with this Specification.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. At least one non-transitory machine readable storage medium with instructions stored thereon, the instructions executable by a machine to call the machine to:
   determine that a die is compliant with a Universal Chiplet Interconnect Express (UCIe)-based protocol based on presence of a particular set of registers on the die, wherein the die is to couple to another link partner die by a die-to-die (D2D) link based on the UCIe-based protocol;
   access a capability register in the particular set of registers;
   read available capabilities from the capability register, wherein the available capabilities comprise capabilities of a D2D adapter and a physical layer (PHY) block present on the die;
   determine a set of capabilities in the available capabilities to be enabled for the D2D link;
   write values of a control register to enable the set of capabilities; and
   write a start link training value to the control register to initiate training of the D2D link.

2. The storage medium of claim 1, wherein the available capabilities comprise a raw mode.

3. The storage medium of claim 1, wherein the available capabilities comprise a capability of supporting multiple protocol layers.

4. The storage medium of claim 1, wherein the D2D adapter is coupled to the PHY block on the die by a first interface and a protocol layer block on the die by a second interface, and the D2D adapter is positioned between the protocol layer block and the PHY block in a UCIe protocol stack.

5. The storage medium of claim 1, wherein the D2D adapter is to use values of the control register to negotiate, with the link partner die, a protocol and a flit format to be used on the D2D link.

6. The storage medium of claim 4, wherein the PHY block is to perform training of the D2D link with the link partner die.

7. The storage medium of claim 5, wherein the flit format is determined from one of a plurality of different flit formats defined in the UCIe-based protocol.

8. The storage medium of claim 5, wherein the protocol is determined from one of a plurality of different protocols defined in the UCIe-based protocol, and the flit format is determined based on the protocol.

9. An apparatus comprising:
a die-to-die adapter comprising:
  a set of registers;
  circuitry to:
    determine, from the set of registers, a set of capabilities of the D2D adapter to advertise in a negotiation with a link partner D2D adapter, wherein the D2D adapter is on a die and the link partner D2D adapter is located on a remote link partner die;
    send a first capabilities advertisement message to the link partner D2D adapter to advertise the set of capabilities to the link partner D2D adapter;
    receive a second capabilities advertisement message from the link partner D2D adapter, wherein the second capabilities advertisement message identifies a set of capabilities of the link partner D2D adapter;
    determine shared capabilities of the D2D adapter and link partner D2D adapter; and
    determine a final configuration of a D2D link to couple the die to the link partner die.

10. The apparatus of claim 9, wherein the link comprises a mainband channel and a separate sideband channel, the first capabilities advertisement message is sent on the sideband channel, and the second capabilities advertisement message is received on the sideband channel.

11. The apparatus of claim 9, wherein the set of capabilities is based on results of a training of the link performed by a physical layer (PHY) block on the die, and the D2D adapter is positioned between the PHY block and a protocol layer block on the die to implement a protocol stack.

12. The apparatus of claim 9, wherein the set of capabilities is based on values written by software to a control register in the set of registers.

13. The apparatus of claim 9, wherein retry functionality of the circuitry is to be enabled based on results of physical layer training of the D2D link.

14. The apparatus of claim 10, wherein format of data to be sent on the mainband channel is based on the final configuration of the link.

15. The apparatus of claim 14, wherein the D2D adapter is to select one of a plurality of flit formats for the format based on the final configuration of the link.

16. The apparatus of claim 10, wherein the circuitry is further to send a final configuration message to the link partner D2D adapter over the sideband channel to identify the shared capabilities to the link partner D2D adapter.

17. A system comprising:
a first die;
a second die coupled to the first die by a die-to-die (D2D) link, wherein the second die comprises a port to connect the second die to the D2D link, and the port comprises:
  protocol layer logic to implement a particular interconnect protocol;
  D2D adapter circuitry;
  physical layer (PHY) circuitry; and
  one or more registers associated with the D2D adapter circuitry and the PHY circuitry; and
a software system to read and write values to the one or more registers,
wherein the D2D adapter circuitry is to:
  determine a subset of capabilities to be advertised to a D2D adapter on the first die based on values in the one or more registers; and
  send a capabilities message over a sideband channel of the D2D link to identify the subset of capabilities.

18. The system of claim 17, wherein the first die comprises a processor device, and the second die comprises one of another processor device, a hardware accelerator, or an input/output (I/O) device.

19. The system of claim 17, wherein the first die and the second die are on a same package.

20. The system of claim 17, wherein the first die comprises a first retimer, the second die comprises a second retimer, the first die and the second die are on separate packages, and the D2D link implements an off-package interconnect.

* * * * *